(12) United States Patent
Saito

(10) Patent No.: US 11,481,525 B2
(45) Date of Patent: Oct. 25, 2022

(54) INFORMATION PROCESSING APPARATUS, CONTROL METHOD FOR INFORMATION PROCESSING APPARATUS, AND STORAGE MEDIUM

(71) Applicant: CANON KABUSHIKI KAISHA, Tokyo (JP)

(72) Inventor: Kentaro Saito, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 298 days.

(21) Appl. No.: 16/802,747

(22) Filed: Feb. 27, 2020

(65) Prior Publication Data
US 2020/0285783 A1    Sep. 10, 2020

(30) Foreign Application Priority Data

Mar. 6, 2019 (JP) .............................. JP2019-040880

(51) Int. Cl.
| | |
|---|---|
| *G06F 30/12* | (2020.01) |
| *A01G 7/00* | (2006.01) |
| *G06Q 50/02* | (2012.01) |
| *G06Q 10/10* | (2012.01) |

(52) U.S. Cl.
CPC .............. *G06F 30/12* (2020.01); *A01G 7/00* (2013.01); *G06Q 10/10* (2013.01); *G06Q 50/02* (2013.01)

(58) Field of Classification Search
None
See application file for complete search history.

(56) References Cited

U.S. PATENT DOCUMENTS

2011/0299786 A1* 12/2011 Kazama ................. G06V 20/13
382/225

FOREIGN PATENT DOCUMENTS

| EP | 2393041 A2 | 12/2011 |
|---|---|---|
| JP | 2017102924 A | 6/2017 |

OTHER PUBLICATIONS

Nikka Whisky Distilling Co., Ltd.'s "Experiments pertaining to fruit components and suitability for fermentation in grapes for fermentation", Local Independent Administrative Agency—Hokkaido Research Organization, Central Agricultural Experiment Station, Jan. 1990, Research Results—General Issues, H3—p. 97. Partial English translation provided. Cited in specification.
Extended European Search Report issued in European Application No. 20161335.3 dated Jun. 9, 2020.

* cited by examiner

*Primary Examiner* — Syed A Roni
(74) *Attorney, Agent, or Firm* — Ross, Kimms & McDowell LLP

(57) ABSTRACT

An apparatus that assists an survey of a crop cultivated in each of blocks obtained by dividing a field, comprising: an input unit configured to accept, for an survey executed for the crop, the input of identification information identifying at least one of the surveys, block information indicating the block where the survey has been executed, item information indicating an survey item, and measured values measured at survey positions; and a processing unit configured to cause a transition in the aggregating result to be displayed as a result of the survey, wherein the input unit further accepts the input of a user operation specifying part of the transition of a result of aggregating the input measured values; and of the measured values, the processing unit causes reliability information of the aggregating result of the part to be displayed.

19 Claims, 30 Drawing Sheets

FIG. 3A

```
           {
4201 ——————  "date": "09-23",
4202 ——————  "observations": [
4210 ——————    {
4211 ——————      "point": {"latitude": 139.692019,"longitude": 35.689554},
4212 ——————      "direction": "South",
4213 ——————      "part": "Upper",
4214 ——————      "category": "Brix",
4215 ——————      "value": 8.7
               },
4220 ——————    {
                 "point": {"latitude": 139.691945,"longitude": 35.689539},
                 "direction": "East",
                 "part": "Middle",
                 "category": "Brix",
                 "value": 8.9
               },
               ...
             ]
           }
```

FIG. 3B

```
4401 ——————  [
4410 ——————    {
4411 ——————      "blockID": "B001",
4412 ——————      "outline": [
4413 ——————        {"latitude": 139.691062,"longitude": 35.690064},
                   {"latitude": 139.691684,"longitude": 35.690018},
                   {"latitude": 139.691896,"longitude": 35.689060},
                   {"latitude": 139.691475,"longitude": 35.689051},
                   ...
                 ],
4414 ——————      "rowWidth": 3.5,
4415 ——————      "trunkWidth": 2.5,
4416 ——————      "rowNum": 3,
4417 ——————      "trunkNum": 5,
                 ...
               },
4420 ——————    {
                 "blockID": "B002",
                 ...
               },
               ...
             ]
```

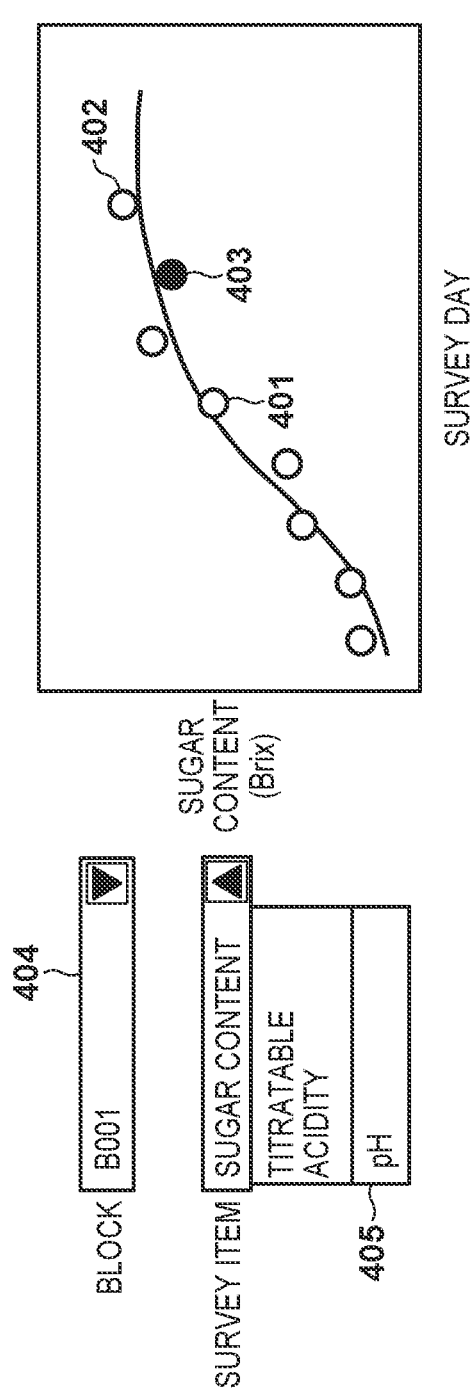
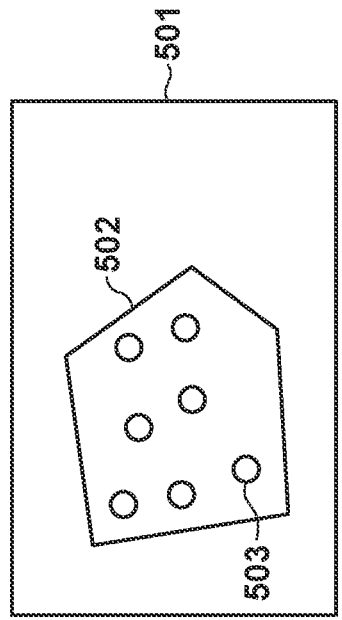
FIG. 4A
FIG. 4B

FIG. 5B

```
[
  {
    "date": "09-23",
    "blockID": "B001",
    "category": "Brix",
    "values": {"mean": 8.72, "stdev": 0.04, ...},
    "points": [
      {"latitude": 139.691862, "longitude": 35.689616},
      {"latitude": 139.691719, "longitude": 35.689621},
      {"latitude": 139.691668, "longitude": 35.689488},
      {"latitude": 139.691908, "longitude": 35.689477},
      ...
    ]
  },
  {
    "date": "09-30",
    "blockID": "B001",
    "category": "Brix",
    "values": {"mean": 9.35, "stdev": 0.06, ...},
    "points": [
      {"latitude": 139.691836, "longitude": 35.689530},
      {"latitude": 139.691728, "longitude": 35.689486},
      {"latitude": 139.691672, "longitude": 35.689597},
      {"latitude": 139.691820, "longitude": 35.689612},
      ...
    ]
  },
  ...
]
```

```
[
  {
    "category": "Brix",
    "items": [
      {
        "date": "09-23",
        "values": {"mean": 8.72, "stdev": 0.04, ...}
      },
      {
        "date": "09-30",
        "values": {"mean": 9.35, "stdev": 0.06, ...}
      },
      ...
    ]
  },
  ...
]
```

```
{
  "date": "09-23",
  "items": [
    {
      "point": {"latitude": 139.692019,"longitude": 35.689554},
      "direction": "South",
      "part": "Upper
    },
    {
      "point": {"latitude": 139.691945,"longitude": 35.689539},
      "direction": "East",
      "part": "Middle
    },
    ...
  ]
}
```

- 6101: "date": "09-23",
- 6102: "items": [
- 6110: {
- 6111: "point": {"latitude": 139.692019,"longitude": 35.689554},
- 6112: "direction": "South",
- 6113: "part": "Upper
- 6120: {

FIG. 9B

```
[
  {
    "date": "09-23",
    "blockID": "B001",
    "category": "Brix",
    "value": 15.3
  },
  {
    "date": "09-23",
    "blockID": "B001",
    "category": "TA",
    "value": 0.98
  },
  ...
]
```

- 6210: {
- 6211: "date": "09-23",
- 6212: "blockID": "B001",
- 6213: "category": "Brix",
- 6214: "value": 15.3
- 6220: {
- 6223: "category": "TA",

FIG. 9C

```
[
  {                                  /-6310
    "date" "10-15",                  /-6311
    "blockID": "B001",               /-6312
    "category": "Brix",              /-6313
    "place": "laboratory",           /-6314
    "values": {"mean": 15.2},        /-6315
    "points": [          —6316         6317
      {"latitude": 139.691836,"longitude": 35.689530},
      {"latitude": 139.691728,"longitude": 35.689486},
      {"latitude": 139.691672,"longitude": 35.689597},
      {"latitude": 139.691820,"longitude": 35.689612},
      ...
    ]
  },
  {                                  ← 6320
    "date" "10-15",
    "blockID": "B001",
    "category": "Brix",
    "place": "field",                ← 6324
    "values": {"mean": 14.8,"stdev": 0.04, ...},   ← 6325
    "points": [                      ← 6326
      {"latitude": 139.691862,"longitude": 35.689616},
      {"latitude": 139.691719,"longitude": 35.689621},
    ]
  },
  ...
]
```

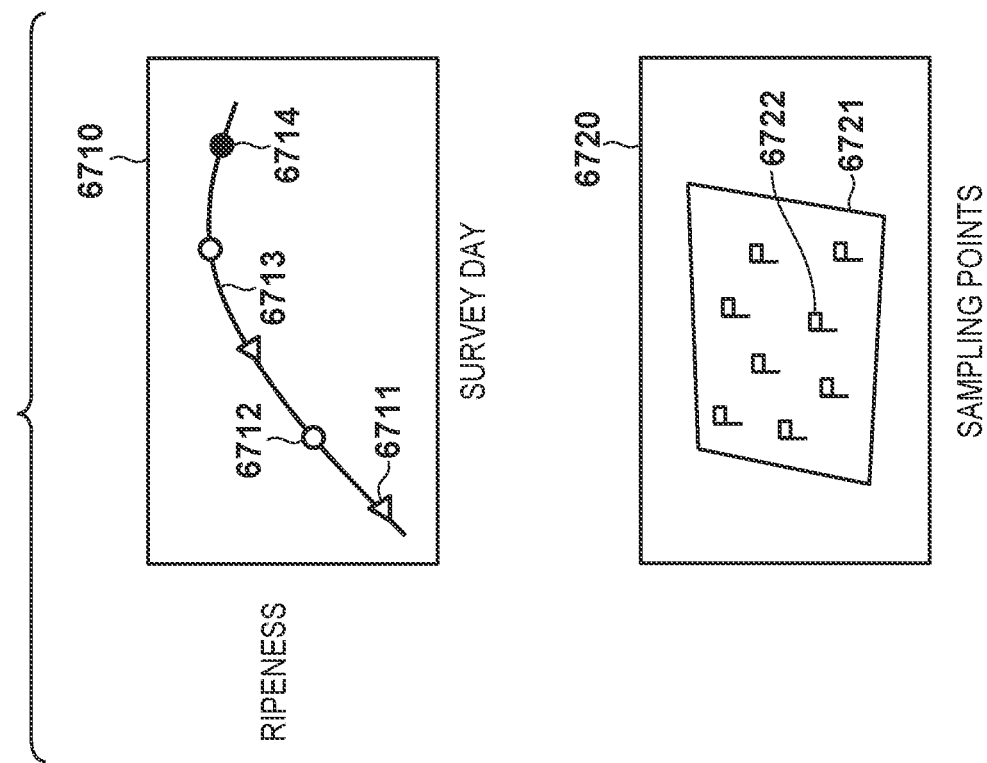
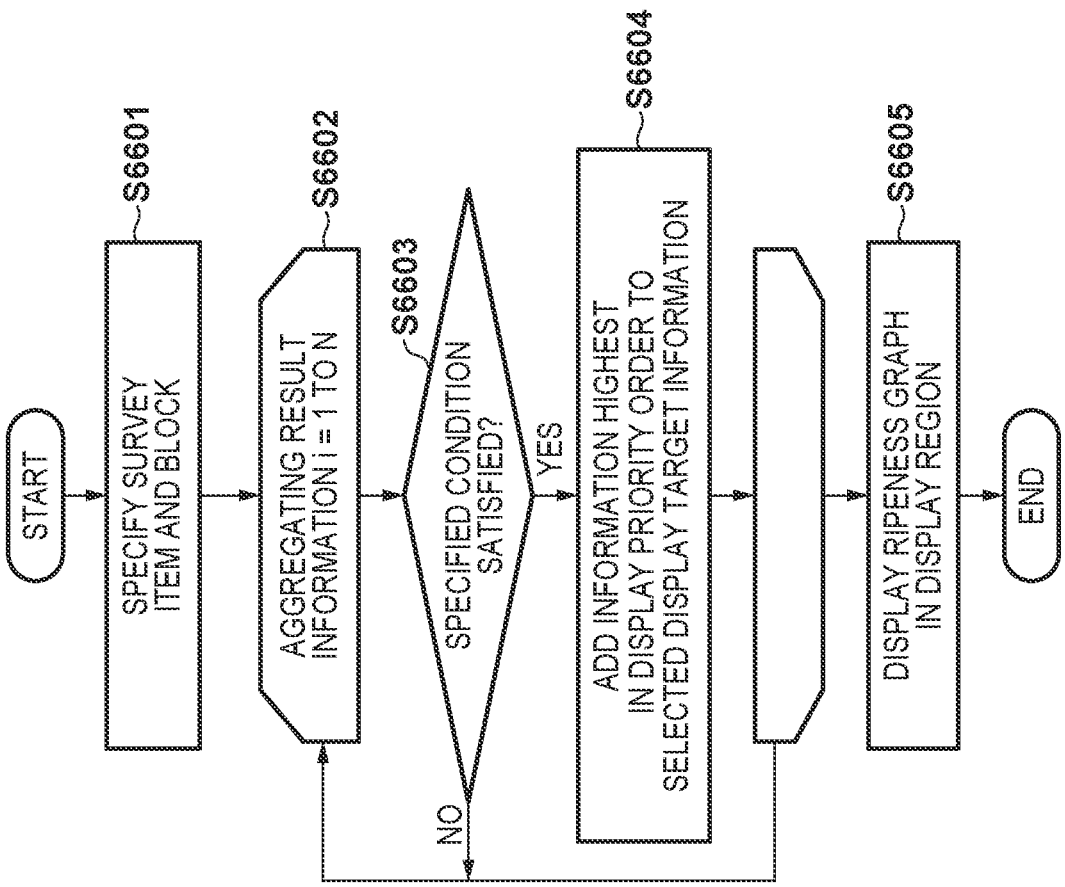

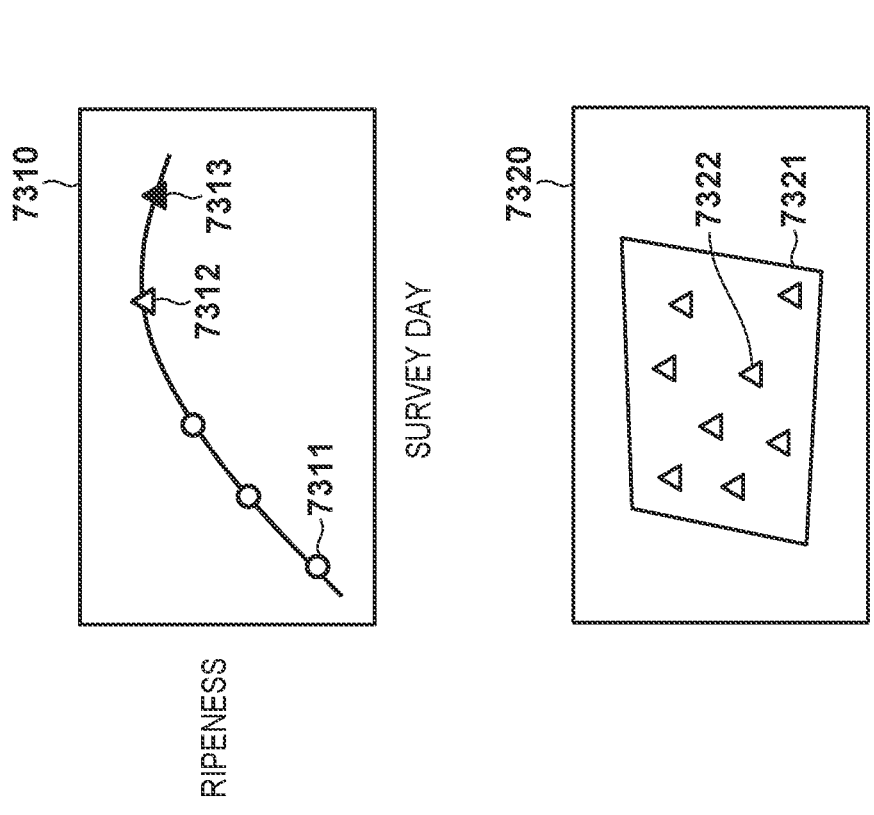
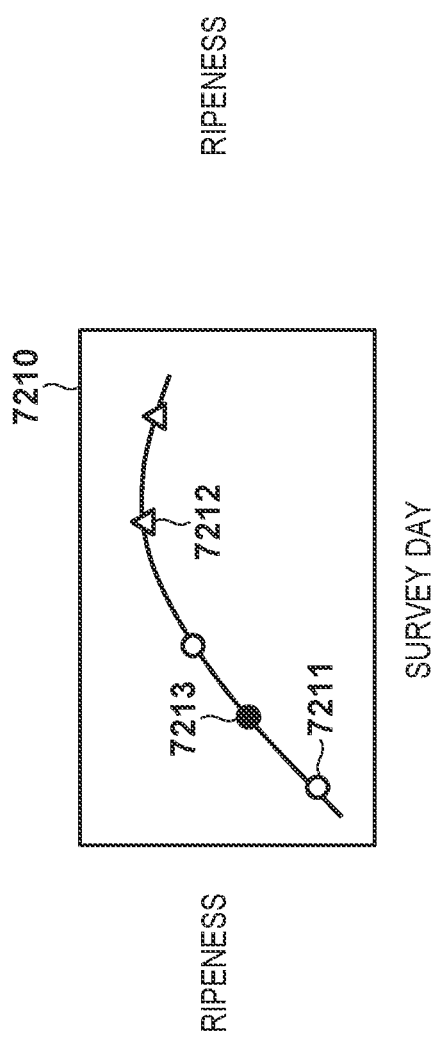
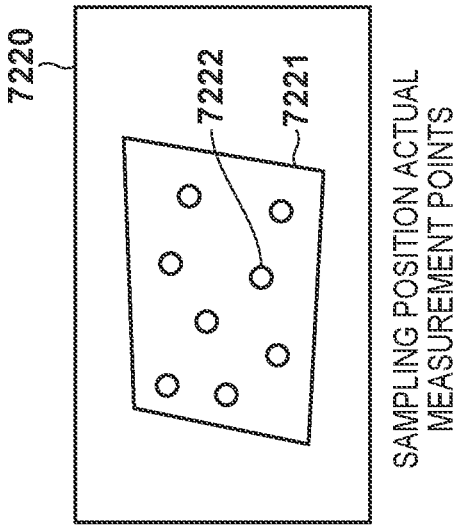

F I G. 17A
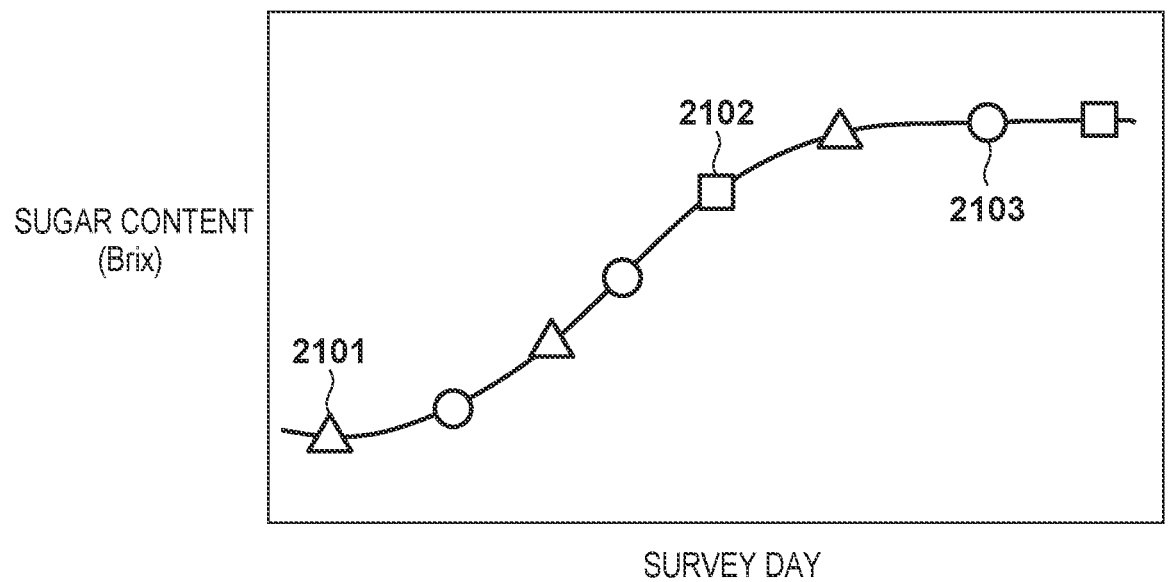
F I G. 17B
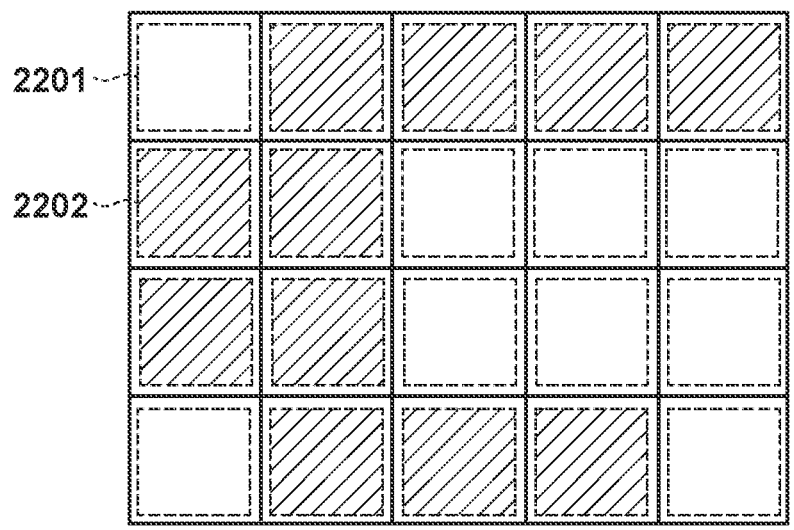

F I G. 20A
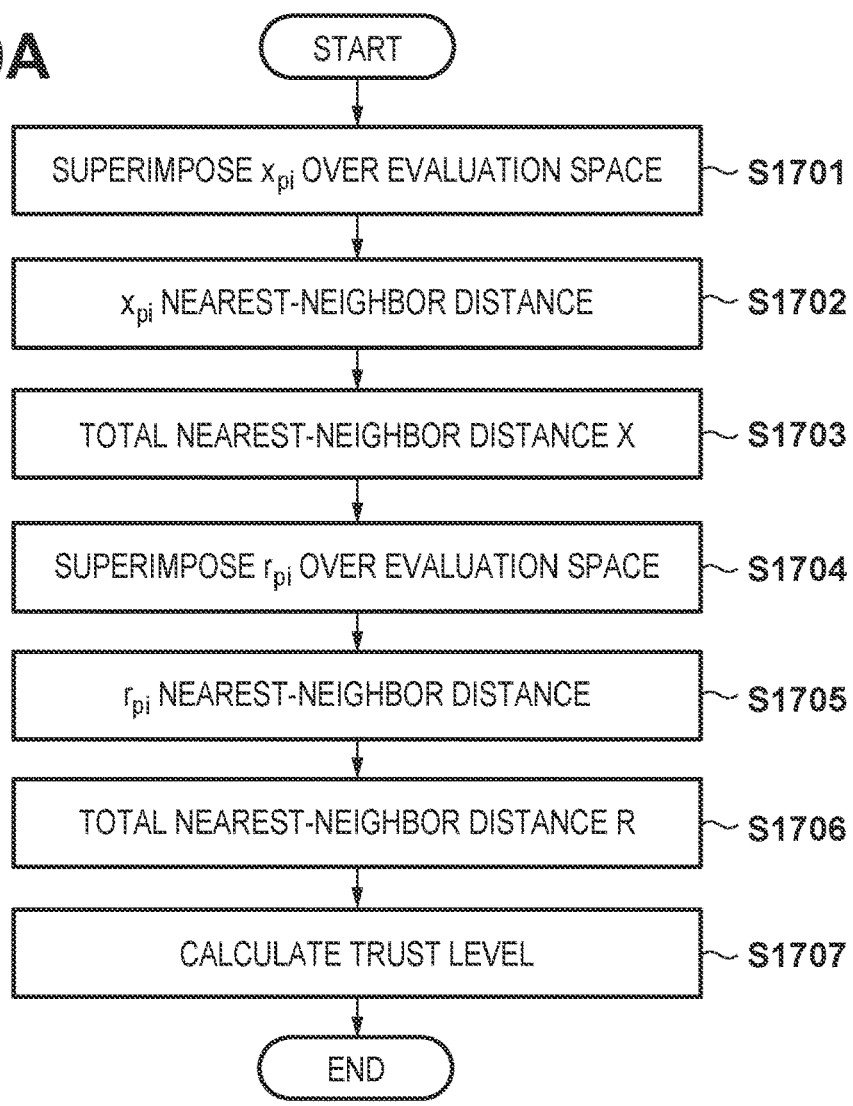
F I G. 20B
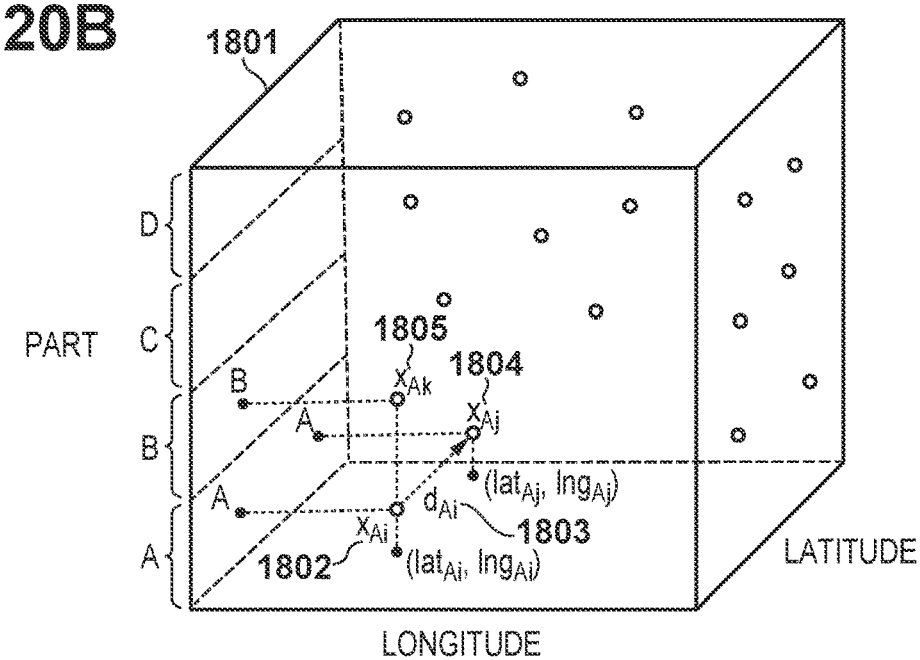

F I G. 21C
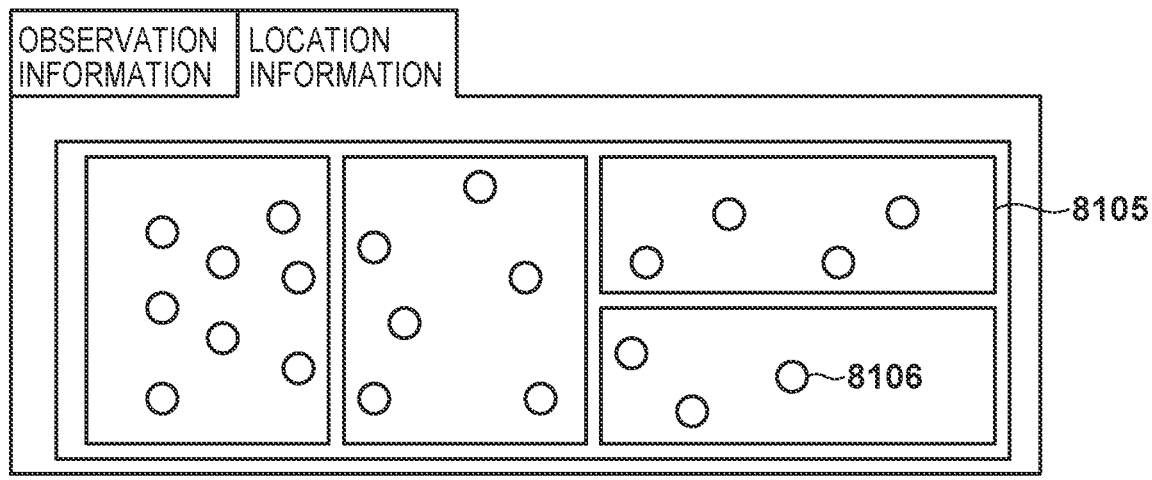
F I G. 21D
|  | June 2018 | | | July 2018 | | |
|---|---|---|---|---|---|---|
|  | 1 | 10 | 20 | 1 | 10 | 20 |
| GROWTH LEVEL SURVEY | ▨ | ▢ | ▨ | ▨ | ▢ | ▨ |
| ESTIMATED HARVEST AMOUNT SURVEY |  | ▨ |  |  | ▨ |  |
| RIPENESS SURVEY |  | ▨ |  | ▢ | ▨ ▢ ▨ ▢ | |
|  |  | 8201 |  | 8202 |  |  |

| SURVEY DAY | SUGAR CONTENT | TITRATABLE ACIDITY | pH | TRUST LEVEL |
|---|---|---|---|---|
| 09/20 | 15.3 | 0.59 | 5.1 | 0.10 |
| 10/01 | 16.9 | 0.60 | 4.4 | 0.75 |
| 10/05 | 18.5 | 0.61 | 3.9 | 0.95 |
| 10/10 | 21.3 | 0.61 | 3.5 | 1.00 |
| 10/12 | 20.1 | 0.62 | 3.1 | 1.00 |

INFORMATION PROCESSING APPARATUS, CONTROL METHOD FOR INFORMATION PROCESSING APPARATUS, AND STORAGE MEDIUM

BACKGROUND OF THE INVENTION

Field of the Invention

The present invention relates to an information processing apparatus, a control method for an information processing apparatus, and a storage medium.

Description of the Related Art

When cultivating a crop (e.g., grapes), even the same type of crop in the same area (e.g. vineyard block) will have varying states of ripeness depending on the location of the crop. Additionally, to ascertain the harvest period of the crop, it is necessary to gather multiple samples over a period to measure items which serve as ripeness indicators, such as sugar content, titratable acidity, and pH.

In the large-scale cultivation of grapes for wine, the vineyards to be examined are large, and thus the number of samples and sampling points are sometimes changed from survey to survey in order to balance survey cost with accuracy.

Carrying out multiple surveys in a given period and creating a ripeness graph for a crop (grapes) has been disclosed in Nikka Whisky Distilling Co., Ltd.'s "Experiments pertaining to fruit components and suitability for fermentation in grapes for fermentation", Local Independent Administrative Agency—Hokkaido Research Organization, Central Agricultural Experiment Station, January 1990, Research Results—General Issues, H3—pg. 97, online— retrieved Apr. 30, 2018, from https://www.hro.orjp/list/agricultural/center/kenkyuseika/gaiyosho/h03gaiyo/1990 034.htm. Meanwhile, Japanese Patent Laid-Open No. 2017-102924 discloses using GPS to measure harvest locations during harvesting, measuring the quality of crops at each harvest location using a quality-detecting device, and displaying relationships therebetween on a map.

However, the past techniques do not take into account the reliability of the results of examining the crops, and there is thus the possibility that inappropriate harvesting will be carried out on the basis of inaccurate information.

Having been achieved in light of the foregoing issue, the present invention provides a technique for making it possible to understand the reliability of crop surveys.

SUMMARY OF THE INVENTION

According to one aspect of the present invention, there is provided an information processing apparatus that assists an survey of a crop cultivated in each of blocks obtained by dividing a field, the apparatus comprising: an input unit configured to accept, for an survey executed for the crop, the input of identification information identifying at least one of the surveys, block information indicating the block where the survey has been executed, item information indicating an survey item of the survey, and measured values measured at a plurality of survey positions in the survey; a storage unit configured to store a result of aggregating the input measured values in association with the identification information, the block information, and the item information; and a processing unit configured to cause a transition in the aggregating result to be displayed in a display unit as a result of the survey executed one or more times for the same block and the same survey item, wherein the input unit further accepts the input of a user operation specifying part of the transition of the aggregating result displayed in the display unit; and of the measured values displayed in the display unit, the processing unit causes reliability information of the aggregating result of the part specified by the user to be displayed in the display unit.

Further features of the present invention will become apparent from the following description of exemplary embodiments (with reference to the attached drawings).

BRIEF DESCRIPTION OF THE DRAWINGS

FIG. 3A illustrates the data structure of a survey result according to a first embodiment.

FIG. 3B illustrates the data structure of block information according to the first embodiment.

FIG. 4A is a ripeness graph.

FIG. 4B illustrates a sampling reliability information display using sampling positions (survey positions).

FIG. 5B illustrates the data structure of an aggregating result according to the first embodiment.

FIG. 5C illustrates the data structure of ripeness graph information according to the first embodiment.

FIG. 9A illustrates the data structure of sampling information according to a second embodiment.

FIG. 9B illustrates the data structure of measurement result information according to the second embodiment.

FIG. 9C illustrates the data structure of an aggregating result according to the second embodiment.

FIG. 11A is a flowchart illustrating the display of a ripeness graph according to the second embodiment.

FIG. 11B illustrates the display of a ripeness graph and sampling reliabilities according to the second embodiment.

FIG. 12B illustrates the display of actual measurement information according to the third embodiment.

FIG. 12C illustrates the display of plan information according to the third embodiment.

FIG. 17A illustrates a ripeness graph according to the fifth embodiment.

FIG. 17B illustrates a sampling reliability information display according to the fifth embodiment.

FIG. 20A is a flowchart illustrating the calculation of a trust level according to the seventh embodiment.

FIG. 20B is a diagram illustrating a flowchart according to the seventh embodiment.

FIG. 21C illustrates a sampling reliability information display according to the eighth embodiment.

FIG. 21D illustrates a scheduler in which the display changes depending on a trust level, according to the eighth embodiment.

DESCRIPTION OF THE EMBODIMENTS

Figure 1A:
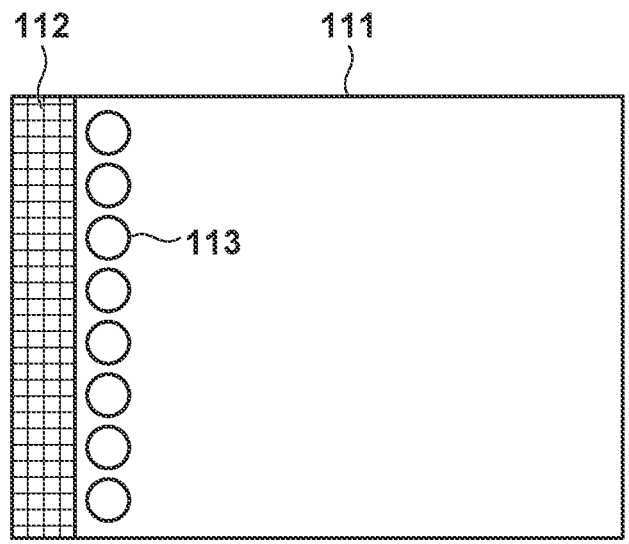
FIG. 1A is a diagram illustrating a block and sampling points.

Hereinafter, embodiments will be described in detail with reference to the attached drawings. Note, the following embodiments are not intended to limit the scope of the claimed invention. Multiple features are described in the embodiments, but embodiments of the invention do not require all such features to fulfil their purpose in accordance with the disclosure herein, and multiple such features may be combined as appropriate. Furthermore, in the attached drawings, the same reference numerals are given to the same or similar configurations, and redundant description thereof is omitted.

First Embodiment

The present embodiment will describe an example of examining the ripeness state of a bunch of grapes when cultivating wine grapes. However, the present embodiment may be applied when examining other items such as the growth state, infectious disease state, pest damage state, or the like of a grapevine, as well as when examining crops aside from grapes for wine.

In the modern wine industry, large-scale wine companies divide labor between cultivating the wine grapes and making the wine. At a vineyard, a vineyard manager manages and harvests the wine grapes along with farmers. The harvested grapes are collected at the wine production factory, and are fermented by a person in charge of wine production. The person in charge of wine production at the wine production factory ascertains the growth state and ripeness state of the grapes in each vineyard as appropriate, and creates a wine production plan.

In wine fermentation, the grapes, which are the raw material, have a major effect on the quality, taste, and so on of the wine. In particular, the quality, taste, and so on of the wine is better when the wine is produced with grapes harvested at a proper level of ripeness, as opposed to when such is not the case. Thus to find the proper harvest period, the ripeness of the grapes is examined in the vineyard.

Even the same type of wine grapes, in the same vineyard, will have different levels of ripeness depending on exposure to sunlight, ventilation, temperature differences in the ground surface, and so on. In other words, even surveys carried out on the same day and at the same time will show different ripenesses due to differences in the positions where samples are gathered from a block, the direction, height, and exposure to sunlight of the bunches of grapes, and so on. Different ripenesses even occur in the same bunch of grapes due to differences in exposure to sunlight at the top and bottom of the bunch. Accordingly, taking into account the position within a block, the part of the vine where the bunch is connected, and where in the bunch the grapes are located makes it possible to more correctly determine the appropriateness of the ripeness survey.

Figure 1B:
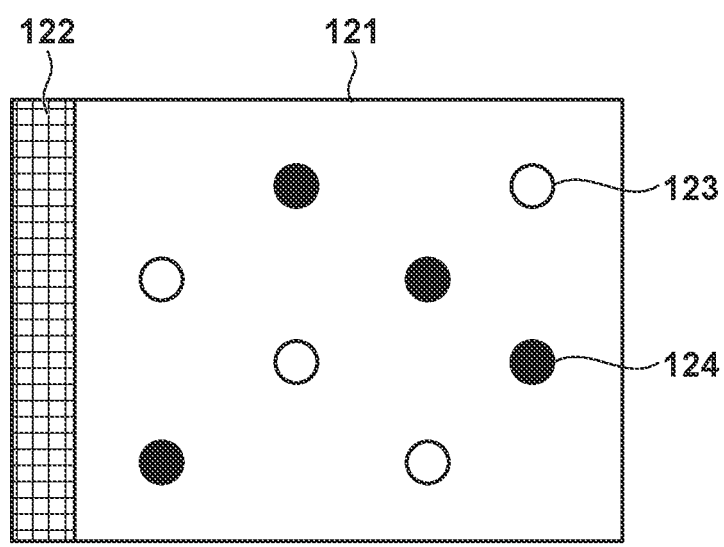
FIG. 1B is a diagram illustrating a block and sampling points.

This will be described in more detail with reference to FIGS. 1A and 1B. FIG. 1A is a diagram illustrating a survey with significant imbalance, and FIG. 1B is a diagram illustrating a survey with little imbalance. A quadrangle 111 and a quadrangle 121 represent the outlines of blocks. A grid area 112 and a grid area 122 represent roads. Circles 113, circles 123, and circles 124 represent sampling positions (survey positions). White circles 113 and white circles 123 represent samples gathered from a sunny side, whereas black circles 124 represent samples gathered from a shady side.

In the large-scale cultivation of wine grapes, all the grapes within a block are harvested, stored in a single tank, and fermented to produce the wine. In the example illustrated in FIG. 1A, the only grapes that are examined are those located along the road. These grapes are thus well-ventilated and are on the side with good sunlight. Not all grapes in the block have these conditions. As such, if all the grapes within the block are harvested and used to produce wine in a single tank, the state of the harvested grapes as a whole stored within the single tank will diverge from the survey result. However, in FIG. 1B, surveys are carried out at non-specific (more diverse) positions throughout the block, and furthermore, samples are gathered uniformly from both the sunny side and the shady side. In other words, the conditions such as sunlight exposure, ventilation and so on, of the sampled positions are more diverse. FIG. 1B, which uses this kind of sampling survey, provides a survey result closer to the state of the grapes harvested from the single block as a whole and stored within the single tank than the survey illustrated in FIG. 1A. It will be appreciated that another way of thinking about reliability of sampling information is to consider the degree of diversity of the sampling points. The greater the diversity the more reliable the sampling information should be. There are several independent aspects of diversity. Increasing any one of them is useful and within the scope of the present invention. Increasing two, more, or all diversity aspects is better still. The diversity aspects include spatial diversity (distribution across a block), the direction of growth or exposure, the ventilation, sunshine exposure, height on the vine, age of the vine, etc.

However, a survey such as that illustrated in FIG. 1B increases the distance of movement for the surveys, which increases the survey costs. For example, although easily-accessible areas along roads require little time for movement and therefore involve low survey costs, examining a central part of the block requires time to move to the sampling points, which increases the survey costs. Furthermore, increasing the number of sampling points, increasing the number of parts of the grapevines that are examined, and the like all lead to increased survey costs as well.

A graph representing the ripeness of wine grapes is a graph that represents the survey day on the horizontal axis and the ripeness on the vertical axis, as indicated in FIG. 4A, for example. The graph is constituted by markers 401 indicating the date of survey and the measured value, and a line 402 that is expressed by a polynomial expression and that is drawn so that the least square distance from each marker 401 is minimized. The ripeness level is measured using an item such as sugar content or acidity, for example. The graph in FIG. 4A will be described in detail later. Note that rather than the survey day indicated in FIG. 4A, the horizontal axis may use the number of days that have passed since the fruit appeared on the vine, the number of days that have passed since flowering, and so on.

The ripeness graph is used to determine whether the grapes are ripening normally, predict the day on which a target ripeness will be achieved on the basis of the slope of the graph, and so on. There are two main methods for measuring the ripeness when sampling from multiple points. In one method, the ripeness is measured at each sampling point and the average thereof is taken as the ripeness of the block in question. In the other method, samples gathered from the respective sampling points in the same block are placed in the same bag and squeezed, and the ripeness is measured from the juice that is obtained.

By eliminating imbalances in the survey positions and parts where the samples are gathered, the ripeness survey will produce a value closer to that which would be found if all of the grapes in the block were harvested. This type of sampling survey, i.e., one that is carried out to achieve the value closer to that which would be found if all of the grapes in the block were harvested, is a highly-reliable survey. Carrying out such a highly-reliable survey has an effect of improving the accuracy of various types of determinations, predictions, and so on made using the slope of a graph in which the survey data is aggregated.

The terms "sampling reliability", "sampling reliability information", and "sampling trust level" used in the description of the invention will be defined hereinafter.

"Sampling reliability" is an indicator for determining whether or not the result of a sampling survey correctly reflects the state resulting from harvesting a crop from an entire block, taking into account the number of samples, the number of survey points, and the parts from which the samples were gathered in the sampling survey of the crop.

For example, superimposing the outline of the block being examined and the sampling points as sampling reliability information on a map makes it possible for a user to understand the sampling method and ascertain (evaluate) the reliability of the sampling method.

"Sampling trust level" is a level indicating the degree to which the sampling survey can be trusted, from the standpoint of the number of samples, the number of survey points, and the parts from which the samples were gathered. The level can be expressed as a numerical value, and is a number obtained by using the flowcharts, equations, and so on described later to quantify items pertaining to the sampling method, such as the position where the sample was gathered during the survey, the direction, the part, and so on.

Note that the display of the "sampling trust level" is one display format for helping to understand whether sampling was carried out correctly in the survey, and thus the "sampling trust level" can be said to be one form of the "sampling reliability information".

Next, the first embodiment will describe a representative embodiment pertaining to the display of the ripeness graph and the sampling reliability information in each survey. In the first embodiment, ripeness information and location information are measured at each sampling point during a survey, and the survey result is input to a crop survey support apparatus, which is an information processing apparatus. The crop survey support apparatus then carries out various types of processing and displays the sampling reliability information.

Hardware Configuration of Crop Survey Support Apparatus (Information Processing Apparatus)

Figure 2A:
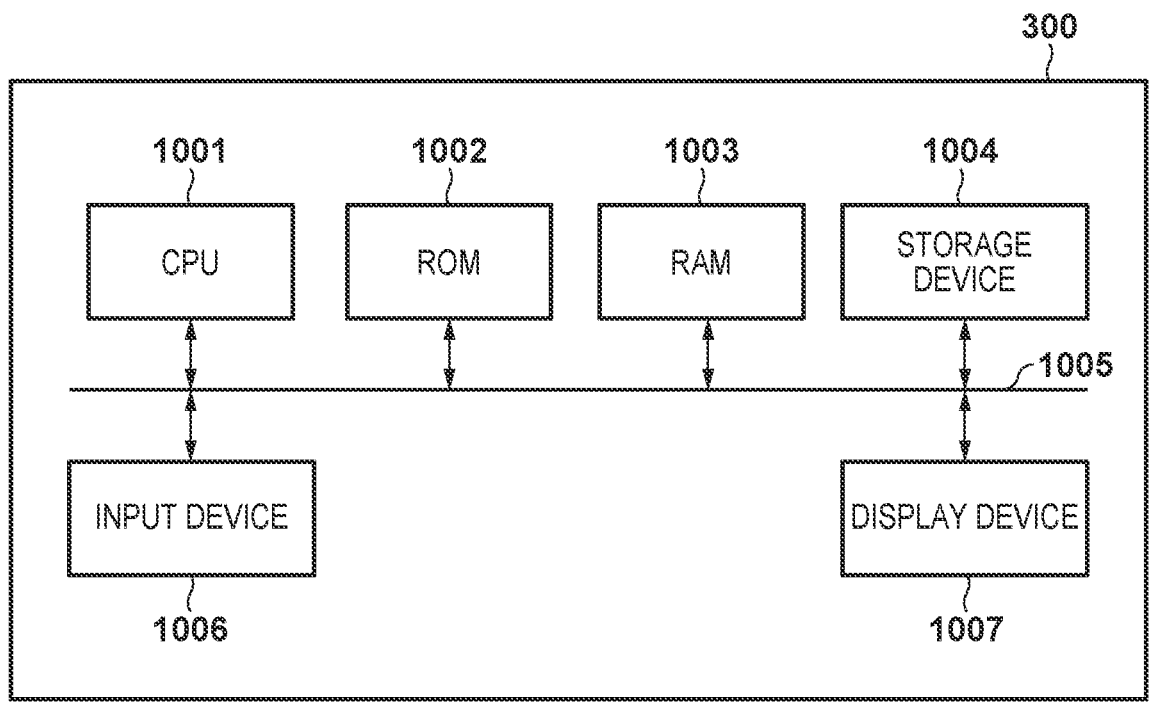
FIG. 2A is a diagram illustrating a hardware configuration.

FIG. 2A is a diagram illustrating the hardware configuration of a crop survey support apparatus 300. The crop survey support apparatus 300 includes a CPU 1001, ROM 1002, RAM 1003, a storage device 1004, a bus 1005, an input device 1006, and a display device 1007. The crop survey support apparatus 300 is constituted by an information processing apparatus such as a generic personal computer or the like.

The CPU 1001 controls various operations carried out by function blocks (described later) of the crop survey support apparatus 300. The details of that control are designated by programs in the ROM 1002, the RAM 1003, and so on, which will be described later. The CPU 1001 can also cause multiple computer programs to run in parallel. The ROM 1002 holds computer programs, data, and so on in which sequences for the control carried out by the CPU 1001 are stored. The RAM 1003 holds control programs for processing carried out by the CPU 1001, and also provides a work area for various types of data used when the CPU 1001 executes various types of control. Although the functions of program code held in a recording medium such as the ROM 1002, the RAM 1003, and so on are realized by the CPU 1001 reading out and executing that code, any type of recording medium may be used.

The storage device 1004 can store various types of data and the like. The storage device 1004 includes a recording medium, such as a hard disk, a floppy disk, an optical disk, a magnetic disk, a magneto-optical disk, magnetic tape, a non-volatile memory card, or the like, as well as a drive that drives the recording medium and records information. The computer programs, data, and so on that are stored are loaded into the RAM 1003 as necessary in response to instructions from a keyboard or the like, instructions from various types of computer programs, and so on.

The bus 1005 is a data bus connected to each of the constituent elements, and is used to implement communication among the constituent elements, implement the high-speed exchange of information, and so on. The input device 1006 provides various types of input environments to the user. Although a keyboard, mouse, and the like are conceivable as elements for providing various types of input operation environments, a touch panel, a stylus, or the like may be used as well.

The display device 1007 is constituted by an LCD or the like, and displays the states of various types of input operations, the resulting computational results, and so on to the user. Note that the configuration described above is merely a example, and the configuration is not limited to the configuration described above.

Functional Configuration of Crop Survey Support Apparatus

Figure 2B:
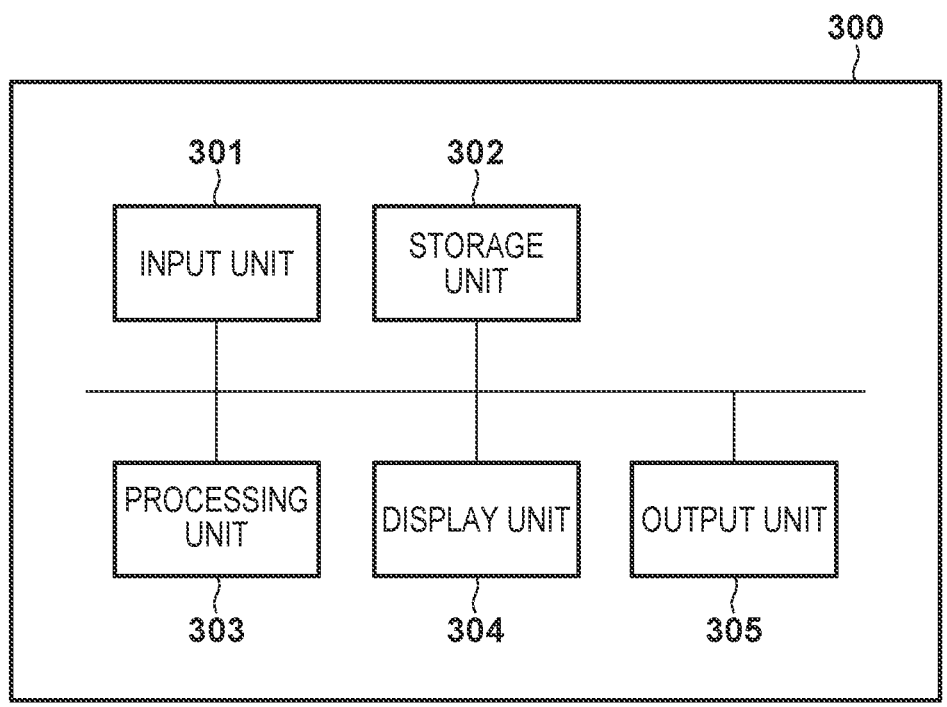
FIG. 2B is a diagram illustrating a functional configuration.

FIG. 2B is a diagram illustrating the functional configuration of the crop survey support apparatus 300. The crop survey support apparatus 300 includes an input unit 301, a storage unit 302, a processing unit 303, a display unit 304, and an output unit 305. The configuration may be such that only one of the display unit 304 and the output unit 305 is provided. For example, if the crop survey support apparatus 300 is a web server, the crop survey support apparatus 300 creates data for display in a client's web browser and transmits that data to the client from the output unit 305. In this case, the display unit 304 is unnecessary. Additionally, if the crop survey support apparatus 300 is a personal computer, it is sufficient for processing results to be displayed in the display unit 304, and thus the output unit 305 is unnecessary.

In the first embodiment, a examiner uses a survey terminal (not shown) at a vineyard to measure and record location information using GPS, as well as measure the sugar content, titratable acidity, and pH of the grapes and record the measured values. The examiner also enters survey identification information, such as the survey date, into the survey terminal. The survey result is input to the input unit 301 of the crop survey support apparatus 300 using an SD card, USB memory, wireless LAN, near-field communication, or the like. In addition to the present embodiment, the second and subsequent embodiments (described later) can also be realized by the crop survey support apparatus 300 having the same hardware and functional configurations as those described here.

Data Structure of Survey Result Information

Here, FIG. 3A is a diagram illustrating the survey result information input to the input unit 301 of the crop survey support apparatus 300 in the first embodiment, in the JSON format. date 4201 is information for identifying a unit of survey. observations 4202 is a string holding information containing sampling information and observation information from each of sampling points, such as information 4210 and information 4220.

Here, the sampling information is constituted by a sample gathering location point 4211, a sample direction 4212, and a sample gathering part 4213. The location where the sample was gathered is constituted by a latitude and a longitude measured by the GPS. The sample gathering location, the sample direction (north, south, east, or west), and the sample gathering part (top, middle, bottom) are related to sunlight amount and ventilation, and are therefore information that affects the ripeness of the grapes. Furthermore, in the first embodiment, the observation information is constituted by a survey item category 4214 and a measured value 4215. For surveys of the ripeness of grapes, the survey items are the sugar content, titratable acidity, pH, color, size of each grape, diameter of each grape, seed ripeness, aroma, and so on.

Data Structure of Block Information

FIG. 3B is a diagram illustrating the block information in JSON format. Information 4410 and information 4420 are objects which manage various attributes of each block, and multiple pieces of block information for a vineyard are held and managed in a string 4401.

The block information 4410 is constituted by the following elements.

blockID 4411: an ID for identifying the block
outline 4412: outline information of the block
rowWidth 4414: a gap between rows
trunkWidth 4415: a gap between vines (trunks) in the row direction
rowNum 4416: the number of rows contained in a single mesh section
trunkNum 4417: the number of vines (trunks), in the row direction, contained in a single mesh section The outline information of the block is managed as a string of longitude information and latitude information 4413 of the corners of the outline.

A mesh section is described later with reference to FIG. 16B.

Example of Ripeness Graph Display

FIG. 4A is a diagram illustrating an example of the ripeness survey result being displayed in graph format in the display unit 304. The ripeness graph is created in units of blocks. The horizontal axis of the graph represents the survey day, and the vertical axis represents a statistically-aggregated value of the ripeness measurement results.

Circles 401 and circles 403 are markers created for each survey, in accordance with the survey day and the ripeness. The markers are white circles when in an unselected state, and are black circles when in a selected state. The solid line 402 is an assistive line for helping to determine the optimal harvest day. A polynomial expression that provides the minimum square distance from each marker for the same survey item is used in this embodiment. It will be appreciated by those skilled in the art that any suitable algorithm may be used to fit a curve to the markers and it is not essential to use a polynomial expression or least minimum square fit.

A list box 404 displays a list of blocks to display in the ripeness graph. The user can select a specific block by manipulating the list box 404. A list box 405 displays a list of survey items to display in the ripeness graph. The user can select a specific survey item by manipulating the list box 405.

Example of Display of Sampling Reliability Information

FIG. 4B is a diagram illustrating an example in which the sampling reliability information is displayed in the display unit 304 in map format. A frame line 501 is a map display area. A frame line 502 is an outline of the block corresponding to the block identifying ID selected in the list box 404 of FIG. 4A. Circles 503 are sampling positions in the survey, corresponding to the marker selected in FIG. 4A (the marker 403, in the example illustrated here). The sampling reliability information in the first embodiment is displayed with the outline of the block and the sampling positions (survey positions) superimposed on the map, as illustrated in FIG. 4B.

Processing

Figure 5A:
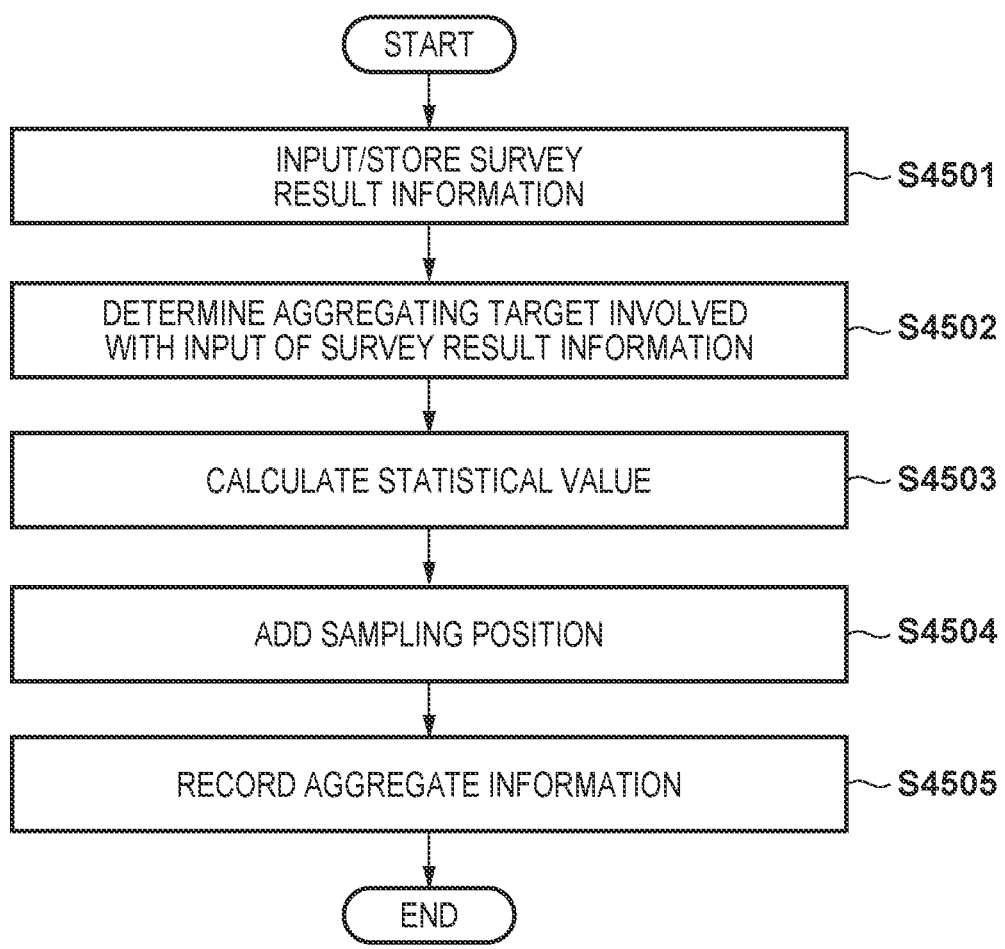
FIG. 5A is a flowchart illustrating an aggregating process carried out during the input of survey result information according to the first embodiment.

FIG. 5A is a flowchart illustrating the creation of aggregating process results, illustrated in FIG. 5B and described later, when data recorded in a survey terminal at a vineyard is entered into the crop survey support apparatus 300.

In step S4501, the processing unit 303 stores the survey result information input through the input unit 301 in the storage unit 302. In step S4502, the processing unit 303 determines a compound identifier to be subjected to the aggregating. The aggregating is carried out in units of a compound identifier, which includes a survey identifying ID, a block identifying ID, and a survey item ID. Accordingly, first, these IDs are determined for the survey result information which has been input.

Assuming the survey result information of FIG. 3A, the survey identifying ID is date 4201. The block identifying ID is calculated on the basis of the survey result information of FIG. 3A and the block information of FIG. 3B, which is recorded in the storage unit 302. Specifically, it is determined within which outline 4412 the point 4211 is located. When it has been determined that the point 4211 is within an outline 4412, the blockID 4411 of that outline 4412 is taken as the block identifying ID of the survey result information to which that point 4211 belongs. Here, the Crossing Number Algorithm, the Winding Number Algorithm, and the like are known as methods for determining whether or not a point is on the inside of an area, and the calculation may be carried out using such an algorithm. Assuming the survey result information of FIG. 3A, the survey item ID is category 4214.

In step S4503, the processing unit 303 calculates a statistical value for the measured value 4215 in the survey result information belonging to the compound identifier determined to be subject to the aggregation in step S4502. The compound identifier is constituted by the survey identifying ID, the block identifying ID, and the survey item ID. The statistical value is an average value, a most frequent value, or the like. The calculation result is recorded into values 4615 of the aggregating result data illustrated in FIG. 5B. As illustrated in FIG. 5B, more than one type of statistical value may be recorded for the measured values obtained at the sampling points, e.g. a mean value and a standard deviation value.

In step S4504, the processing unit 303 adds, to points 4616 in the aggregating result data in FIG. 5B, the sampling position point 4211 of the survey result information belonging to the compound identifier determined to be subject to the aggregating in step S4502. In step S4505, the processing unit 303 saves the aggregating result data, expressed in the JSON format illustrated in FIG. 5B, in the storage unit 302.

Data Structure of Aggregating Result Data

FIG. 5B is a diagram illustrating the aggregating result data, created through the flowchart of FIG. 5A, in JSON format. As indicated by information 4610 and information 4620, the aggregating result data is constituted by the statistical values and sampling positions aggregated for each compound identifier of {survey identifying ID, block identifying ID, survey item ID}.

date 4611 is the survey identifying ID, and in the example of FIG. 5B, is the survey date. blockID 4612 is the block identifying ID, and is used for identifying the block. category 4613 is the survey item ID, and is used for identifying the survey item. values 4615 is information obtained by statistically processing a measured value 4215 of the observation information for each compound identifier of {survey identifying ID, block identifying ID, survey item ID}, and is an average value, a most frequent value, a standard deviation, a standard error, or the like. points 4616 is a collection of sample gathering positions points 4211 belonging to the compound identifier of {survey identifying ID, block identifying ID, survey item ID}.

Data Structure of Ripeness Graph

FIG. 5C is a diagram illustrating the ripeness graph information for displaying the markers in the ripeness graph of FIG. 4A, in JSON format. The ripeness graph information holds individual survey item information 4710, consolidated for each survey item, in string format.

Each piece of individual survey item information 4710 is constituted by category 4711, which is the survey item ID, and a string items 4712, which holds marker information 4713 corresponding to each marker in the ripeness graph. Each piece of marker information 4713 is constituted by date 4711, which is the survey identifying ID (the survey date, here), and values 4712 corresponding to statistical information 4615 in the aggregating result data of FIG. 5B.

Processing

Figures 6A, 6B:
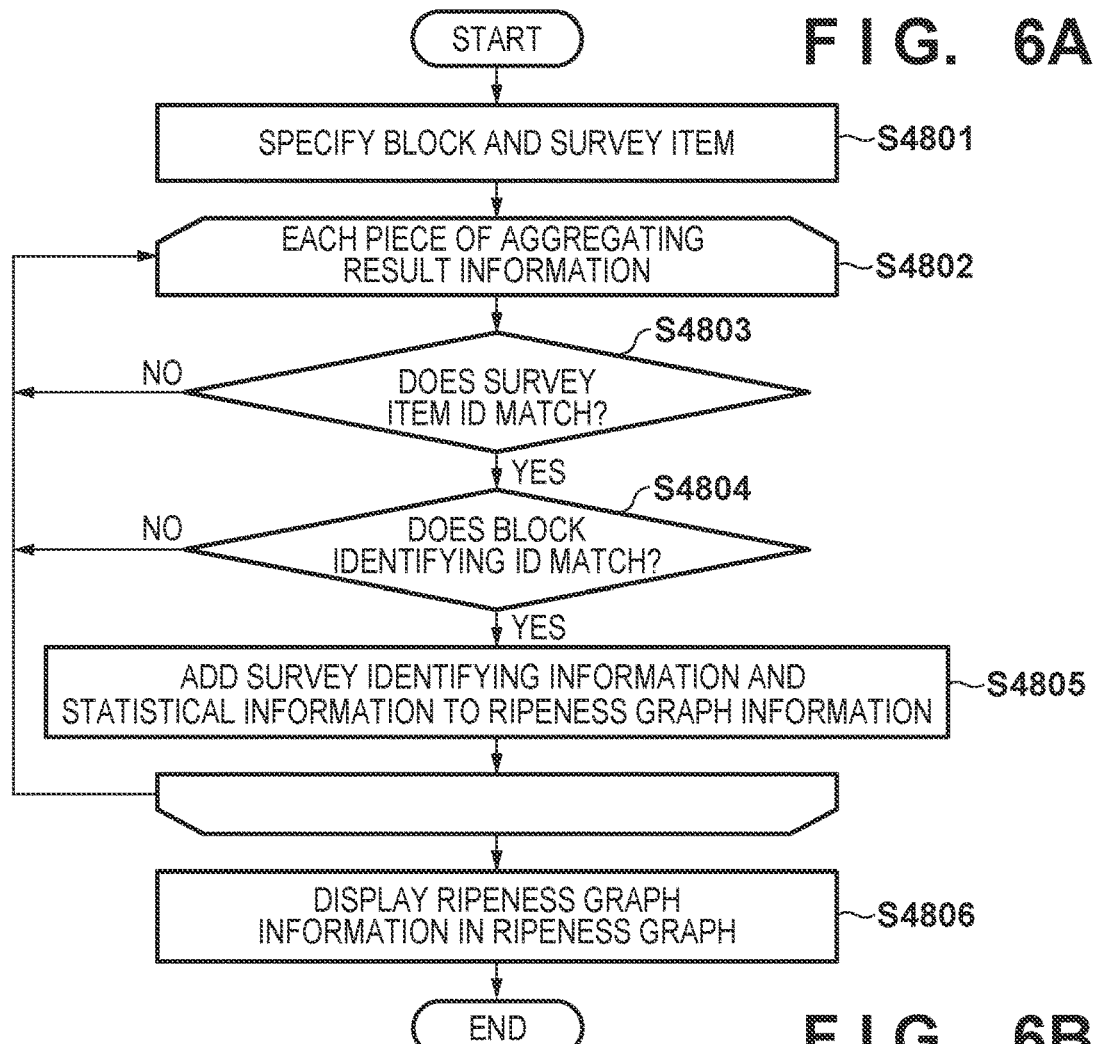
FIG. 6A is a flowchart illustrating the display of the ripeness graph according to the first embodiment.
FIG. 6B illustrates the data structure of sampling reliability information according to the first embodiment.

FIG. 6A is a flowchart illustrating processing for constructing the ripeness graph information of FIG. 5C from the aggregating result data illustrated in FIG. 5B and plotting markers on the ripeness graph of FIG. 4A.

In step S4801, the processing unit 303 specifies a block and a survey item for which markers are to be plotted, in a graph display area of the ripeness graph screen illustrated in FIG. 4A. In the present embodiment, the block and the survey item are specified on the basis of user operations made through the list boxes 404 and 405 displayed in the display unit 304. The loop of step S4802 is repeated for each element that takes the {survey identifying ID, block identifying ID, survey item ID} of the aggregating result data in FIG. 5B as a compound identifier. In step S4803, the processing unit 303 determines whether or not the survey item ID specified in step S4801 matches the survey item ID in the aggregating result information.

In step S4804, the processing unit 303 determines whether the block identifying ID in the list box 404 matches the block identifying ID 4612 in the aggregating result information, in order to narrow down the information of the block specified in step S4801 by the user through the list box 404 of FIG. 4A.

If a determination of YES is made in both step S4803 and step S4804, the process moves to step S4805. In step S4805, the processing unit 303 adds marker information (a survey identifying ID 4714 and statistical information 4715) to the survey item information 4710, in the ripeness graph information, which has the specified survey item ID. However, if there is no individual survey item information 4710 with a matching survey item ID, the individual survey item information 4710 constituted by category 4711 and items 4712 is added first, and the marker information 4710 is then added to that information. After the loop of step S4802, in step S4806, the processing unit 303 displays the ripeness graph information of FIG. 5C, created in step S4705, in the display unit 304 as the ripeness graph of FIG. 4A.

Data Structure of Sampling Reliability Information

FIG. 6B is a diagram illustrating, in the JSON format, the data structure of the sampling reliability information, which is the data used in the sampling reliability screen of FIG. 4B. blockID 4901 is a block identifying ID, and corresponds to the details of the list box 404 in the ripeness graph of FIG.

4A, the blockID 4612 in the aggregating result data of FIG. 5B, and so on. date 4902 is a survey identifying ID, and corresponds to date 4611 in the aggregating result data, date 4714 in the ripeness graph information, and so on.

outline 4903 is block outline information, constituted by the string of the longitude and latitude information 4904, and corresponds to outline 4412 in the block information of FIG. 3B. points 4905 are sampling positions belonging to the compound identifier of {survey identifying ID, block identifying ID, survey item ID}.

Processing

Figure 7:
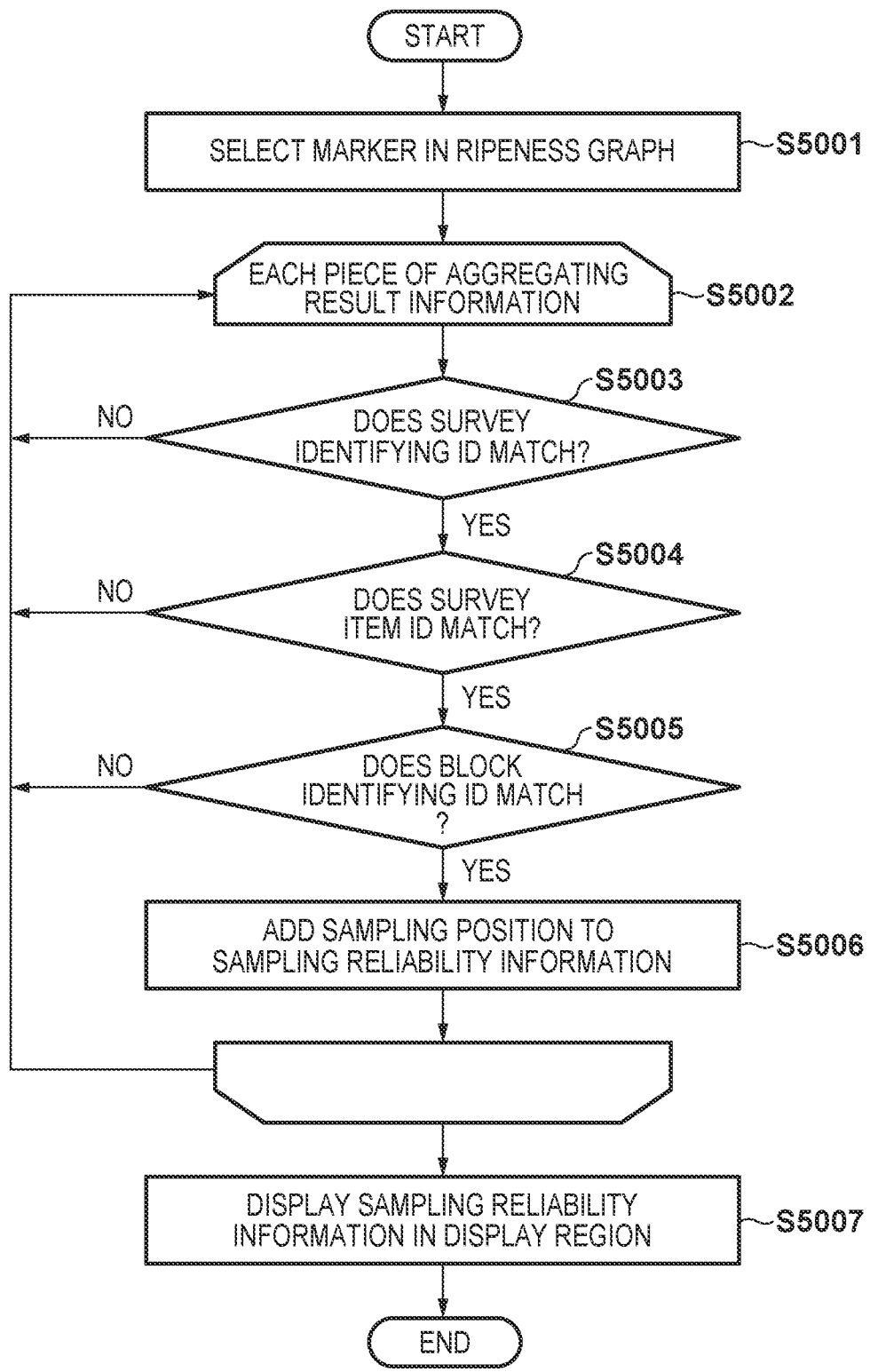
FIG. 7 is a flowchart illustrating the display of a sampling reliability screen according to the first embodiment.

FIG. 7 is a flowchart illustrating processing for constructing the sampling reliability information of FIG. 6B from the aggregating result data illustrated in FIG. 5B, and displaying the sampling reliability information of FIG. 4B. In step S5001, the processing unit 303 specifies the survey for which the user wishes to know the sampling reliability, in accordance with the user selecting the marker 403 in the ripeness graph of FIG. 4A. The markers in the ripeness graph differ depending on the survey identifying ID and the survey item ID, and thus the survey identifying ID and the survey item ID are finalized upon the marker being specified.

The loop of step S5002 is repeated for each element that takes the {survey identifying ID, block identifying ID, survey item ID} of the aggregating result data in FIG. 5B as a compound identifier. In step S5003, the processing unit 303 determines whether the survey identifying ID corresponding to the marker 403 specified by the user matches the survey identifying ID of the aggregating result information 4610.

In step S5004, the processing unit 303 determines whether the survey item ID corresponding to the marker 403 specified by the user matches the survey item ID of the aggregating result information 4610. In step S5005, the processing unit 303 determines whether the block identifying ID specified by the user in the list box 404 matches the block identifying ID in the aggregating result information 4610.

If results of all of the determinations in steps S5003, S5004, and S5005 are YES, the process moves to step S5006. In step S5006, the processing unit 303 adds the sampling point information points 4616 of the aggregating result information 4610 to the sampling reliability information illustrated in FIG. 6B. Note that in the first instance, the sampling point information points 4616 is added after creating the data constituted by the data of the blockID 4901, date 4902, and outline 4903. outline 4903 is the block for which the blockID 4411 in the block information of FIG. 3B matches the blockID of the block specified through the list box 404 in the ripeness graph screen.

After the loop of step S5002, in step S5007, the processing unit 303 displays the sampling reliability information created in step S5006 in the display unit 304 as illustrated in FIG. 4B. For example, the circles indicated in FIG. 4B are added to a map of an application window in which the ripeness graph and list boxes illustrated in FIG. 4A and a blank map are displayed in the display unit 304 of the crop survey support apparatus 300. Alternatively, a window displaying the map illustrated in FIG. 4B pops up separately from the window in which the ripeness graph and list boxes indicated in FIG. 4A are displayed.

The foregoing first embodiment has described an example in which an aggregating process is carried out upon survey result data being input, and an item specified by the user is searched out from the aggregated data and displayed upon the user specifying the information they wish to display. In crop surveys, a massive amount of survey result information is sometimes produced, and thus carrying out the aggregating process in advance makes it possible to shorten the time the user must wait from when they specify the item they wish to reference to when the item is displayed.

Although the first embodiment describes an example in which the block outline and the sampling positions are superimposed on a map in a screen where the sampling reliability information of FIG. 4B is displayed, a heat map may additionally be displayed. In the heat map display, first, a circle is drawn centered on each sampling point, with a higher weighting in the center and a lower weighting at the periphery, and in areas where circles overlap, the respective weights are superimposed (totaled).

Next, colors are added, from dark colors to light colors in accordance with the values of the weighting. By setting the radius of the circle as a reference as to whether the sampling reliability is sufficient, the user can determine whether or not the sampling survey has been carried out sufficiently on the basis of the surface area of areas of the heat map where there is no color or where the color is light.

Equation 1

$$f = \frac{S_{over}}{S_{all}} \quad (1)$$

Equation (1) is an equation for illustrating an embodiment in which the sampling trust level is calculated using a heat map display. The meanings of f, $S_{over}$, and $S_{all}$ in the equation are as follows.

f: sampling trust level $S_{over}$: number of pixels greater than or equal to a threshold $S_{all}$: number of pixels in the block Here, the ratio of the surface area of an area where the darkness of the color is greater than or equal to a set darkness to the surface area of the block is taken as the sampling trust level. Specifically, to calculate the surface area of a reliable area, weights set in a circle drawn central to the sampling point are superimposed over each pixel, after which it is determined whether the superimposed weight exceeds a threshold, and the number of pixels within the block that exceed the threshold are then counted. The sampling trust level is then found by dividing the number of pixels exceeding the threshold by the number of pixels in the block.

Additionally, although the date is used as the survey identifying ID in the first embodiment, a numerical value, a text string, or the like may be used as the survey identifying ID, and a table in which survey identifying IDs and dates are associated with each other may be prepared and managed. Using a method of managing survey identifying IDs and dates in association with each other in a table makes it possible to associate multiple survey days with a single survey identifying ID. If the sampling reliability is low for a survey on a given day, making an additional survey on an unexamined area within the block on a different day and setting the same survey identifying ID makes it possible to consolidate surveys taking place over multiple days into a single survey.

If taking the initial survey with the additional survey results in a survey with a higher sampling reliability, the number of surveys with a high sampling reliability increases by one simply by carrying out the additional survey. If the information of surveys having high sampling reliabilities increases, it becomes possible to use the ripeness graph to determine a harvest day more suited to the actual state.

Note that the configuration may be such that hovering an icon indicating a mouse, which is the input device 1006, over the marker 401 of FIG. 4A causes the sampling reliability information of FIG. 4B to be displayed as a pop-up superimposed over the ripeness graph of FIG. 4A.

Figure 8A:
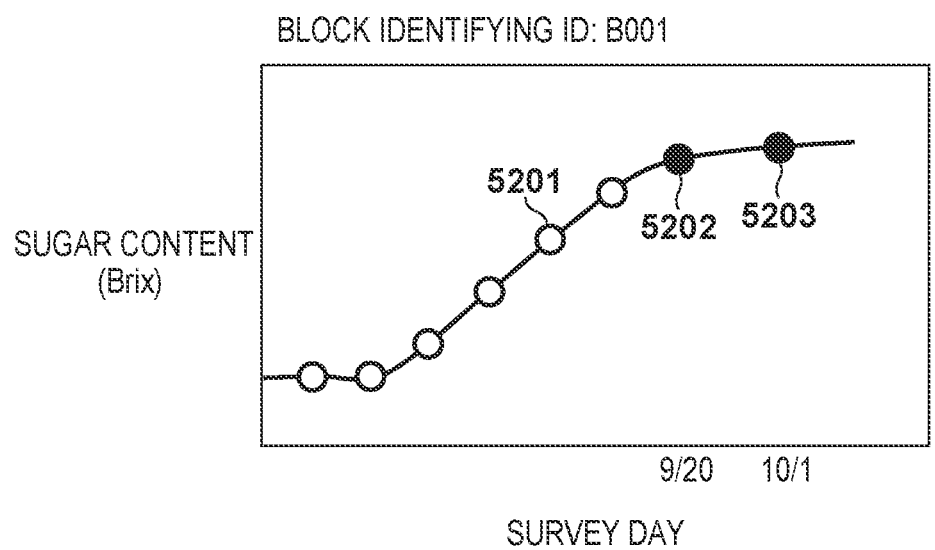
FIG. 8A illustrates the designation of a plurality of surveys in the ripeness graph according to the first embodiment.

Additionally, although the first embodiment describes an example in which the block information and sampling points managed by the crop survey support apparatus 300 are superimposed over a map in response to a marker in the ripeness graph being selected, the configuration may be such that multiple markers in the ripeness graph can be selected. FIG. 8A is a diagram illustrating multiple markers in the ripeness graph being selected at the same time. White circles 5201 are unselected markers, whereas a black circle 5202 and a black circle 5203 are selected markers. The black circle 5202 represents a survey carried out on September 20, whereas the black circle 5203 represents a survey carried out on October 1.

Example of Display of Sampling Reliability Information

Figure 8B:
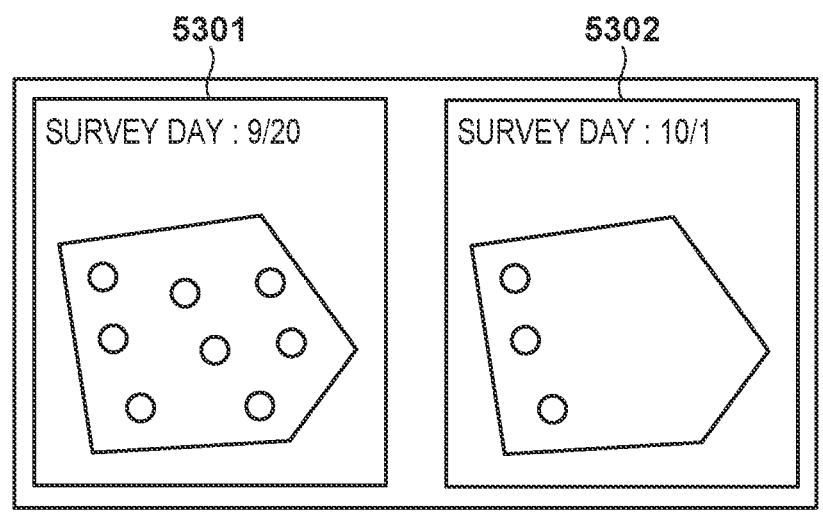
FIG. 8B illustrates a comparative display of a plurality of pieces of reliability information according to the first embodiment.

FIG. 8B illustrates an example of the display of the sampling reliability information when multiple markers in the ripeness graph have been selected at the same time. The sampling reliability information corresponding to the selected markers is displayed side-by-side. When the survey of September 20 and the survey of October 1 have been specified in the ripeness graph, the sampling reliability information 5301 from September 20 and sampling reliability information 5302 from October 1 corresponding thereto are displayed side-by-side. By making it possible to compare the sampling reliability information side-by-side, it is easy to ascertain the relative sampling reliabilities of the surveys.

Although FIG. 8B illustrates an example in which multiple instances of the sampling reliability information are displayed side-by-side, the multiple instances of sampling reliability information may be superimposed within the same map. In this case, different sampling point marks may be used for each survey identifying ID so that the survey identifying ID to which each sampling point corresponds can be distinguished.

First Variation

Here, an example of a screen which clearly displays observations made pertaining to multiple items in a single survey will be described as a first variation. For example, in a vineyard, a ripeness survey and a pest survey may be carried out simultaneously in a single survey. In the first variation as well, sampling positions are superimposed over a vineyard map upon the user selecting a marker on the ripeness graph.

Figure 24A:
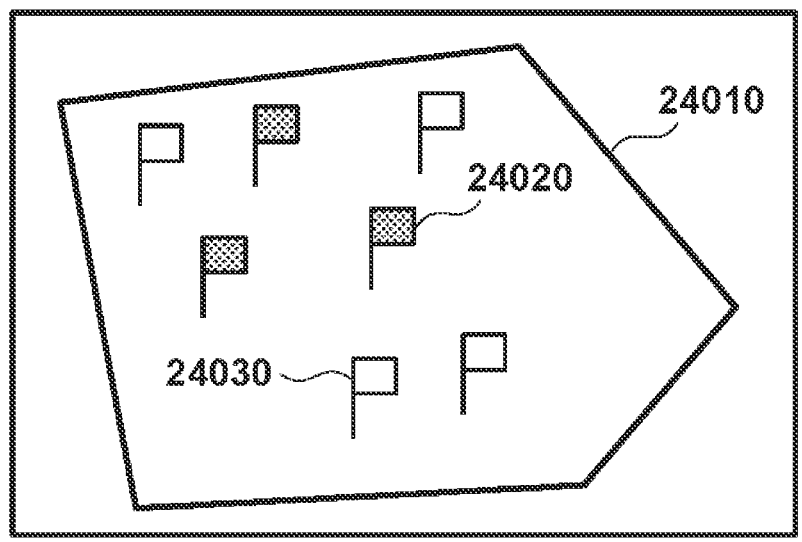
FIG. 24A illustrates a display of sampling reliabilities according to a first variation.

FIG. 24A illustrates an example of a map displayed in the first variation. A frameline 24010 indicates the outline of a block. Black flag markers 24020 indicate the survey points of items corresponding to plots selected on the ripeness graph. Here, these are points where ripeness surveys have been carried out, for example. White flags 24030 indicate the points of surveys for another item, carried out during the same survey (a survey on the same day) as the plots selected in the ripeness graph. Here, these are points where pest surveys have been carried out, for example. In this manner, according to the first variation, all the observation information for multiple items in a single survey is displayed, in a format that makes it possible to distinguish the items selected in the ripeness graph from the other items.

Second Variation

Figure 24B:
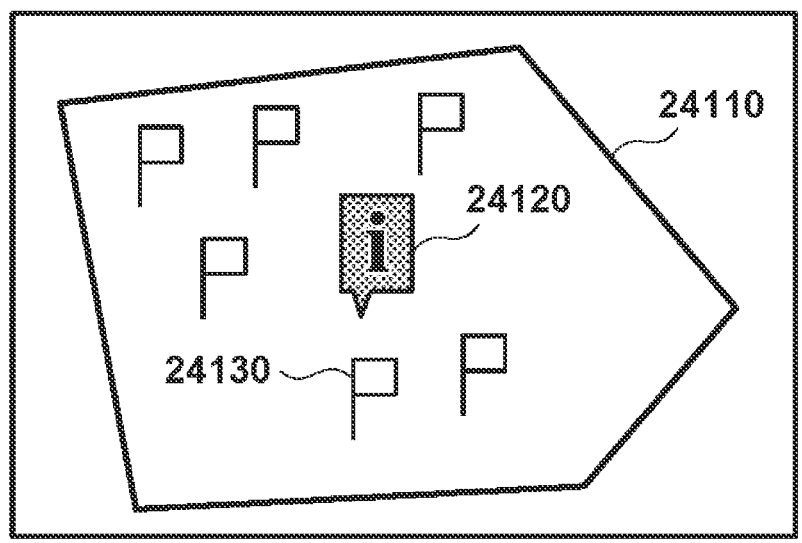
FIG. 24B illustrates a display of sampling reliabilities according to a second variation.

Next, a second variation will describe an example of a screen displayed with block observation information and point observation information distinguished from each other. Survey methods used in the vineyard include point observation surveys, which handle survey results for each of multiple points within a block, and block observation surveys, which handle survey results at the block level. Depending on the case, there are situations where both types of surveys are carried out in a single survey. FIG. 24B illustrates another example of a map displayed in the second variation. In FIG. 24B, the results from a block-level survey and a point-level survey carried out in a single survey are displayed simultaneously and in a distinguishable manner. A line 24110 indicates the outline of a block. An information mark 24120 is an indicator indicating the existence of information of a survey carried out at the block level. White flags 24130 are indicators indicating the presence of point observation information.

Second Embodiment

The first embodiment describes an example in which sample measurement and position measurement are carried out at each sampling point, which makes it possible to easily display the survey positions corresponding to each marker in the ripeness graph. This method is more suited to small-scale vineyards, survey items that can be measured using a handheld measurement instrument, and so on.

On the other hand, a method in which samples are brought back to a lab for analysis is better suited to the analysis of samples of survey items which require an analyzer, sampling carried out for a large number of points in a large-scale vineyard, and so on. In such a case, samples taken from multiple points in the block are collected in a single bag to obtain analysis results for the block.

Meanwhile, there are situations where a large number of samples are brought back to a lab for analysis, and basic surveys are carried out with a handheld measurement instrument for several locations in the vineyard. In this case, there will be two sets of aggregating results that take the {survey identifying ID, block identifying ID, survey item ID} as a compound identifier, as described in the first embodiment, i.e., the measured values at the vineyard and the measured values at the lab. Comparing the basic measured values from the vineyard with the measured values from the lab, which use a large number of samples, the measured values from the lab provide more highly-reliable information.

In light of this, the second embodiment will describe an example in which the same type of reliability information as that described in the first embodiment can be displayed even when carrying out analysis at a lab. Additionally, an example will be described in which when the basic measurement information from the vineyard and the analysis information from the lab are both present, the ripeness graph is created having removed information having a low reliability.

Data Structure of Sampling Information

FIG. 9A is a diagram illustrating, in the JSON format, sampling information from a case where analysis is carried out at a lab. This sampling information is the result of an examiner recording GPS measurement results and the direction and part of the gathered sample in the survey terminal at a sampling position in the vineyard.

date 6101 is the survey identifying ID, and is a date in the second embodiment. items 6102 is a string for holding the sampling information. Information 6110 and information 6120 are the sampling information recorded in the survey terminal at each sampling position. point 6111 is location information, i.e., latitude and longitude measured by the GPS.

direction 6112 is the direction in which the sample is growing on the grapevine. part 6113 is the height at which the sample is growing on the grapevine. After the sampling information has been recorded in the survey terminal at the vineyard, the information is input to the crop survey support apparatus 300 through the input unit 301 and recorded into the storage unit 302.

Data Structure of Measurement Result Information

FIG. 9B is measurement result information obtained by analyzing samples at the block level in the lab. In the lab, multiple items are analyzed using a sample put into a single bag for each block. Information 6210 and information 6220 are information obtained by recording measured values analyzed in the lab, in units of {survey identifying ID, block identifying ID, survey item ID}.

date 6211 is the survey identifying ID, and here, the date is used as the survey identifying ID. blockID 6212 is the block identifying ID. category 6213 and category 6223 are survey item IDs, where Brix in category 6213 indicates the sugar content and TA in category 6223 indicates the titratable acidity. The measurement result information analyzed in the lab is input to the crop survey support apparatus 300 through the input unit 301, and recorded into the storage unit 302.

Data Structure of Aggregating Result Data

FIG. 9C is a diagram illustrating, in JSON format, the aggregating result data according to the second embodiment. The aggregating result data according to the second embodiment is constituted by multiple pieces of information, i.e., information 6310 and information 6320, each of which is aggregated in units of {survey identifying ID, block identifying ID, survey item ID, and analysis location ID}.

The information 6310 is information obtained by gathering samples exhaustively throughout the vineyard and aggregating the survey results with analysis in the lab. The information 6320 is information obtained by aggregating survey results from a basic survey, such as that described in the first embodiment, according to the flowchart of FIG. 5A. date 6311 is a survey identifying ID, blockID 6312 is a block identifying ID, and category 6313 is a survey item ID.

place 6314 and place 6324 are analysis location IDs, where place 6314 indicates that precise analysis was carried out at the lab, and place 6324 indicates that a basic measurement was carried out in the vineyard. Preferably, the analysis location ID in the aggregating result data is specified when the survey results are input to the crop survey support apparatus 300. Additionally, if the data structure is limited to the input data described in the first embodiment with reference to FIG. 3A and the input data described in the second embodiment with reference to FIGS. 9A and 9B, the analysis location ID can be determined automatically from the data structure of the input data and added to the aggregating result information. values 6315 and values 6325 are values obtained by measuring the sample. points 6316 is a string holding information 6317, which is information of the latitude and longitude of the sampling point.

Processing

Figure 10A:
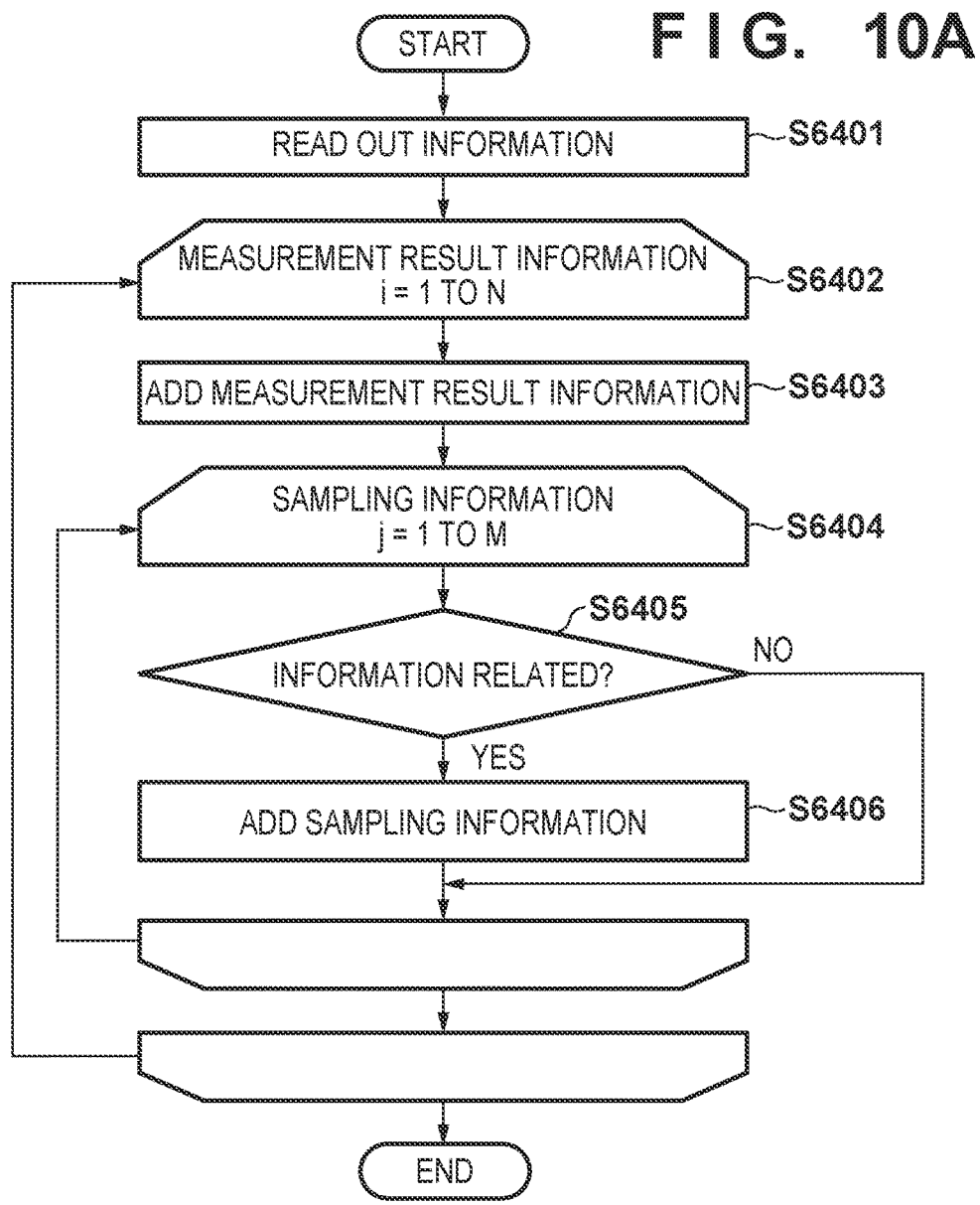
FIG. 10A is a flowchart illustrating an aggregating process according to the second embodiment.

FIG. 10A is a flowchart for a situation where the sampling information is recorded at the vineyard and the samples are analyzed at the lab, and illustrates processing for creating the information 6310 of FIG. 9C by aggregating the data at the timing when the lab analysis results of FIG. 9B are input to the crop survey support apparatus 300. The sampling information recorded at the vineyard as indicated in FIG. 9A and the lab analysis results indicated in FIG. 9B are input to the crop survey support apparatus 300 through the input unit 301, and are recorded in the storage unit 302.

In step S6401, the processing unit 303 reads out, from the storage unit 302, the information of the lab analysis results indicated in FIG. 9B, which have been newly input to the crop survey support apparatus 300, the sampling information indicated in FIG. 9A, which was recorded at the vineyard and input to the aggregating result data in advance, and the block information indicated in FIG. 3B, which has been input to the aggregating result data in advance. The loop of step S6402 is a loop carried out for each piece of information in the lab measurement results indicated in FIG. 9B. Here, "each piece of information" refers to the information 6210, the information 6220, and so on.

In step S6403, the processing unit 303 records the values of date 6211, blockID 6212, category 6213, and value 6214 of the information 6210 in date 6311, blockID 6312, category 6313, and value 6214 of the information 6310. Additionally, the data structure is automatically determined, with the data of FIG. 9B determined to be lab analysis results, and "laboratory" being recorded into place 6314.

The loop of step S6404 is a loop carried out for each element of the sampling information from the vineyard, indicated in FIG. 9A, which has been read out from the storage unit 302. Here, "each element" refers to the information 6110, the information 6120, and so on.

In step S6405, the processing unit 303 determines a relationship between the information 6110 and the information recorded in step S6403. It is determined whether the information 6110 matches the survey identifying ID date and the survey item identifying information category in the information recorded in step S6403. Then, it is determined whether or not the sampling position point 6111 is within the block identifying ID blockID 6212. If a determination of YES is made for all of these, the information is determined to be related, whereas if a determination of NO is made for any of these, the information is determined not to be related.

The method for determining whether or not the sampling position 6111 is within the block identifying ID 6212 will be described here. This determination is made by finding whether or not the sampling position 6111 is located within the block outline information 4412 in which the block identifying ID 6212 and the block identifying ID 4411 match. The determination can be carried out using a Crossing Number Algorithm, a Winding Number Algorithm, or the like.

In step S6406, the processing unit 303 adds the location information point 6111 of the sampling information determined to be related in step S6405 to the string points 6316 that holds the sampling position of the aggregating result data.

Information for Determining Display Priority Order

Figure 10B:
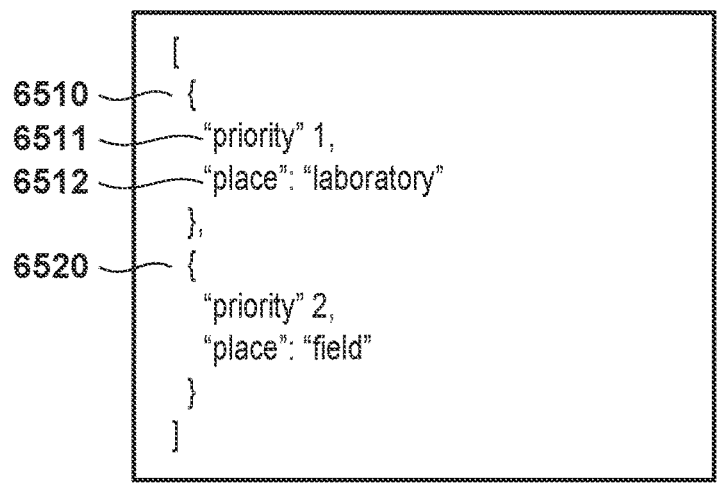
FIG. 10B illustrates the data structure of display priority ordering information according to the second embodiment.

FIG. 10B is a diagram illustrating, in the JSON format, information for determining a display priority order for multiple pieces of information in which the compound identifier of {survey identifying ID, block identifying ID, survey item ID} match.

The information for determining the display priority order is constituted by multiple elements, such as an element 6510 and an element 6520. Each element is constituted by a display priority order priority 6511 and an analysis location ID 6512. The display priority order determines the priority order through a size comparison. In the example of FIG. 10B, the lab measurement result indicated by the element 6510 is defined as being displayed with a higher priority than the vineyard measurement result indicated by the element 6520.

Processing

FIG. 11A is a flowchart illustrating processing for creating the ripeness graph in a situation where both the measured values from the vineyard and the measured values analyzed in the lab are recorded in the crop survey support apparatus 300. In step S6601, the processing unit 303 designates the survey item and block in the ripeness graph on the basis of user operations, through the same method as that described in the first embodiment with reference to FIG. 4A. The loop of step S6602 is a loop carried out for each piece of information, i.e., the information 6310 and the information 6320 of the aggregating result data illustrated in FIG. 9C, which is recorded in the storage unit 302.

In step S6603, the processing unit 303 determines whether each piece of information in the aggregating result data conforms to a user-specified condition. In step S6604, the processing unit 303 adds the information, among the information conforming to the user-specified condition, that has the highest priority, to the ripeness graph information illustrated in FIG. 5C, on the basis of the display priority order defined as indicated in FIG. 10B. In step S6605, the processing unit 303 displays the information created through the loop of step S6602 in the display unit 304.

Example of Ripeness Graph Display

FIG. 11B is an example of the display of the ripeness graph in a situation where both the measured values from the vineyard and the measured values analyzed in the lab are stored in the crop survey support apparatus 300. The display content is constituted by a ripeness graph display area 6710 and a sampling reliability information display area 6720.

In the ripeness graph, the horizontal axis represents the survey day and the vertical axis represents the ripeness, and the information created through the flowchart of FIG. 11A is displayed as markers. Triangular markers 6711 represent the basic measurement results from the vineyard. Circles 6712 represent the analysis results from the lab. When both the basic measurement results and the lab analysis results have been obtained for the same day, the lab analysis results are displayed in accordance with the priority order. Furthermore, a line 6713, which connects the markers of the information higher in the priority order, is displayed. A black circle 6714 represents that the user has selected the marker for referencing the sampling reliability.

The information corresponding to the marker selected by the user in the ripeness graph is displayed in the sampling reliability information display area 6720 in accordance with the flowchart illustrated in FIG. 7. In FIG. 11B, an outline 6721 of the block displayed in the ripeness graph, and a flag symbol 6722 indicating the sampling position corresponding to the marker selected in the ripeness graph, are indicated. Because the marker for the lab analysis results (the marker 6714) is selected in the ripeness graph 6710 in FIG. 11B, the position where the sample analyzed in the lab was gathered is displayed in the sampling reliability information display area 6720, even if a basic measurement was also taken on the same day.

Although the lab analysis results are displayed with priority over the basic survey results using a table for determining the display priority order in the second embodiment, it should be noted that the markers for both the lab analysis results and the basic survey results may be displayed in the ripeness graph. Even in this case, the markers higher in the priority order may be connected by the line 6713 in the ripeness graph. Additionally, for the display of the sampling points when a marker is selected, it is preferable that the sampling point corresponding to the selected marker be displayed.

Third Embodiment

A third embodiment will describe an example in which information of a sampling plan position (plan information) is used as substitute information when actual position measurements (e.g. GPS measurements) are and are not taken at a sampling position. The sampling position plan information uses the same data structure as that described in the second embodiment with reference to FIG. 9A.

Processing

Figure 12A:
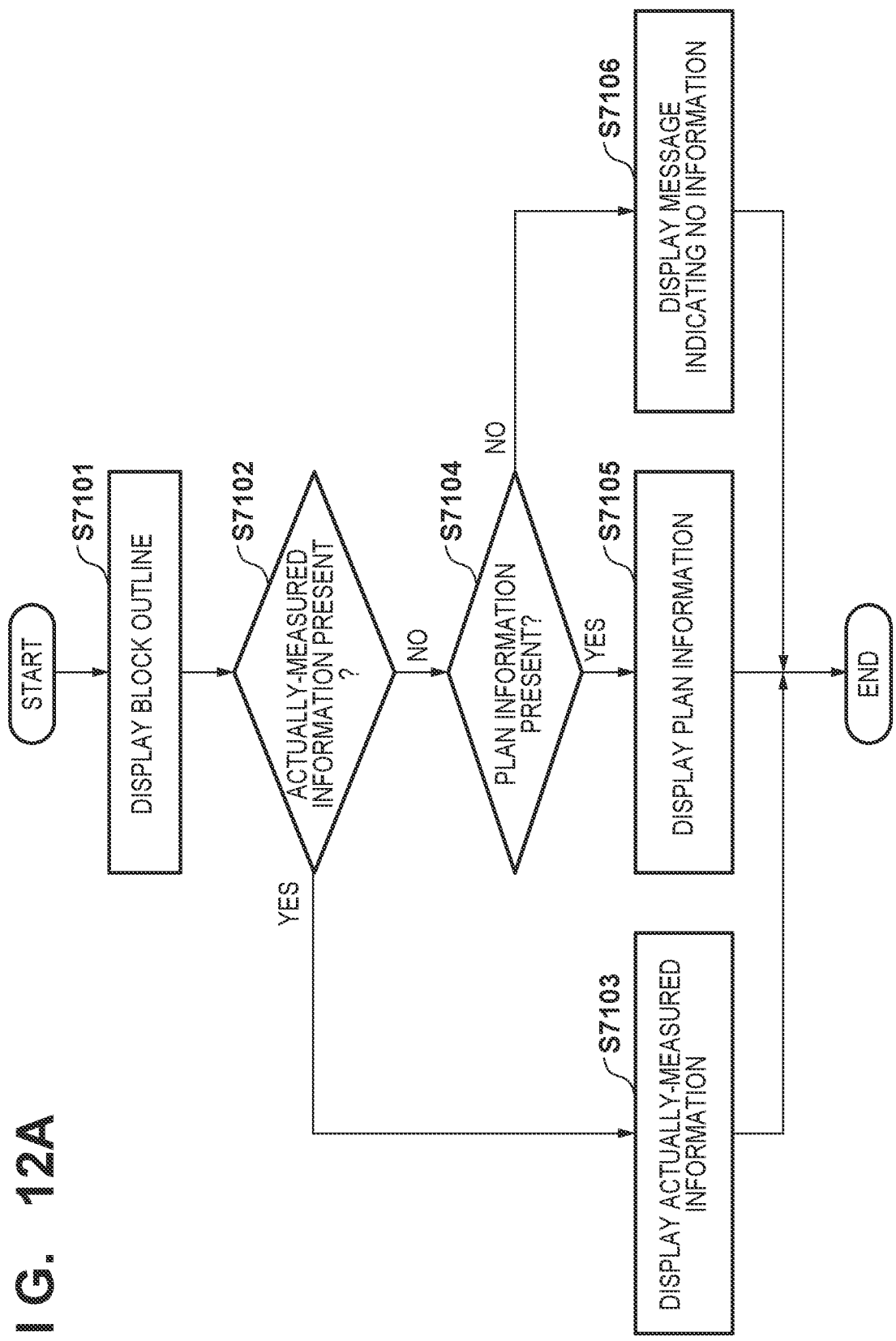
FIG. 12A is a flowchart according to a third embodiment.

FIG. 12A is a flowchart illustrating a sequence of processing for displaying information, among an actually-measured sampling position and a sampling plan position, which is higher in a priority order, in a sampling reliability information display area. More specifically, this flowchart illustrates the process of step S5007 in FIG. 7 in detail.

In step S7101, the processing unit 303 displays a block area in the sampling reliability information display area. In step S7102, the processing unit 303 determines whether or not there is actual measurement information for the sampling position corresponding to the ripeness survey result. The actual measurement information of the sampling position may be obtained by measuring the longitude and latitude using the GPS, or, if a row number, a vine number, or the like is available, by using such a number. If it is determined that there is actual measurement information for the sampling position corresponding to the ripeness survey result, the process moves to step S7103. On the other hand, if it is determined that there is no actual measurement information for the sampling position corresponding to the ripeness survey result, the process moves to step S7104.

In step S7103, the processing unit 303 displays the actual measurement information as the sampling reliability information in a superimposed manner. In step S7104, the processing unit 303 determines whether or not there is plan information pertaining to the sampling position. If it is determined that there is plan information pertaining to the sampling position, the process moves to step S7105. On the other hand, if it is determined that there is no plan information pertaining to the sampling position, the process moves to step S7106.

In step S7105, the processing unit 303 displays the plan information pertaining to the sampling position as the sampling reliability information in a superimposed manner. In step S7106, the processing unit 303 outputs a message indicating that there is no information to display, such as "No Data".

Sampling Reliability Information Display Example (Display of Either Actual Measurement Information or Plan Information)

FIGS. 12B and 12C are examples of the display of the sampling reliability information according to the flowchart of FIG. 12A. FIG. 12B is an example of the display carried out in step S7103. The display content is constituted by a ripeness graph display area 7210 and a sampling reliability information display area 7220.

The markers indicated by white circles 7211 in the ripeness graph represent data pertaining to the actual locations where sampling was carried out, and pressing these markers results in the actual location information of where the sampling was carried out being displayed in the sampling reliability information display area 7220. The markers indicated by triangles 7212 in the ripeness graph represent that although there is no actual location information of where the sampling was carried out, there is plan information as substitute information, and pressing these markers results in the sampling plan position being displayed in the sampling reliability information display area 7220. A black circle 7213 in the ripeness graph indicates that that marker is selected, and when the marker is selected, a block outline 7221 and a position 7222 where sampling was actually carried out are displayed in a superimposed manner in the sampling reliability information display area 7220.

FIG. 12C is an example of the display carried out in step S7105. The display content is constituted by a ripeness graph display area 7310 and a sampling reliability information display area 7320. The markers indicated by white circles 7311 in the ripeness graph represent information of the actual locations where sampling was carried out, and pressing these markers results in the actual location information of where the sampling was carried out being displayed in the sampling reliability information display area 7320.

The markers indicated by triangles 7312 in the ripeness graph represent that although there is no data pertaining to the actual location information of where the sampling was carried out, there is plan information as substitute information, and pressing the markers results in the sampling plan position being displayed in the sampling reliability information display area 7220.

A black triangle 7313 in the ripeness graph indicates that that marker is selected, and when the marker is selected, a block outline 7321 and a plan position 7322 for sampling are displayed in a superimposed manner in the sampling reliability information display area.

The flowchart of FIG. 12A illustrates an example in which when both the actually-measured value from a sampling position and the plan information are present, which of those is to be displayed is determined in accordance with the priority order; however, both of these may be displayed in a superimposed manner.

Processing

Figure 13B:
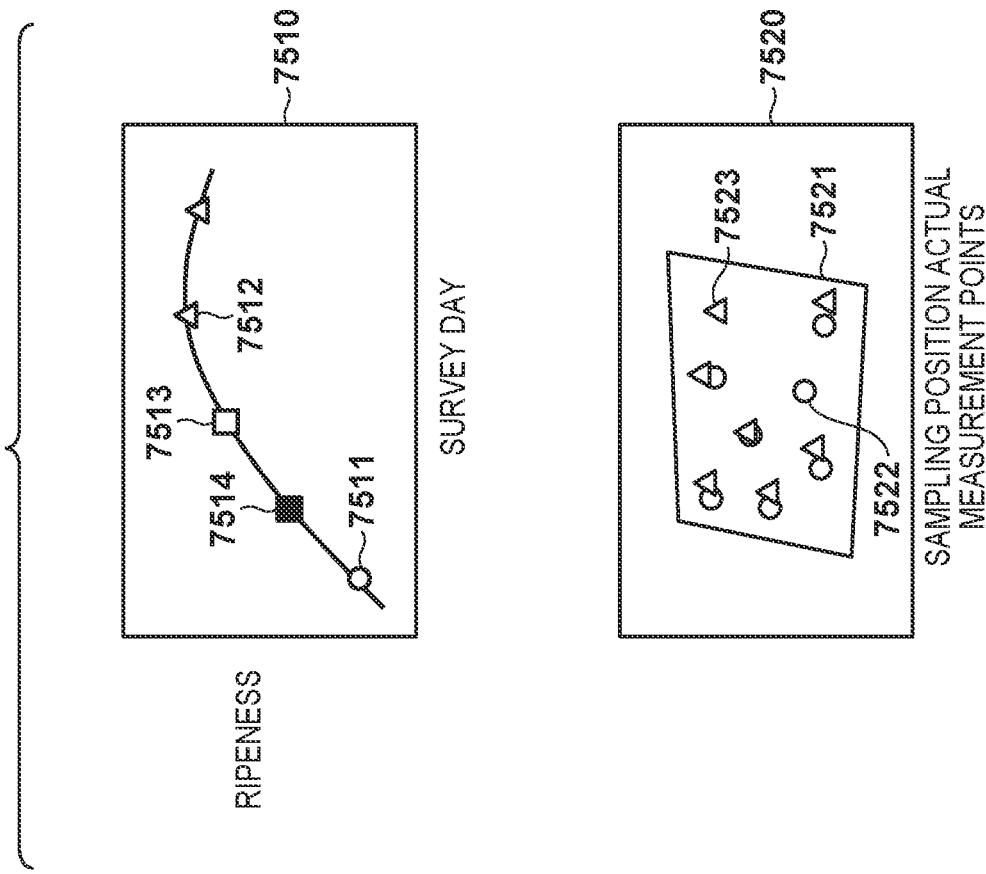
FIG. 13B illustrates a display in which actual measurement information and plan information are superimposed, according to the third embodiment.
Figure 13A:
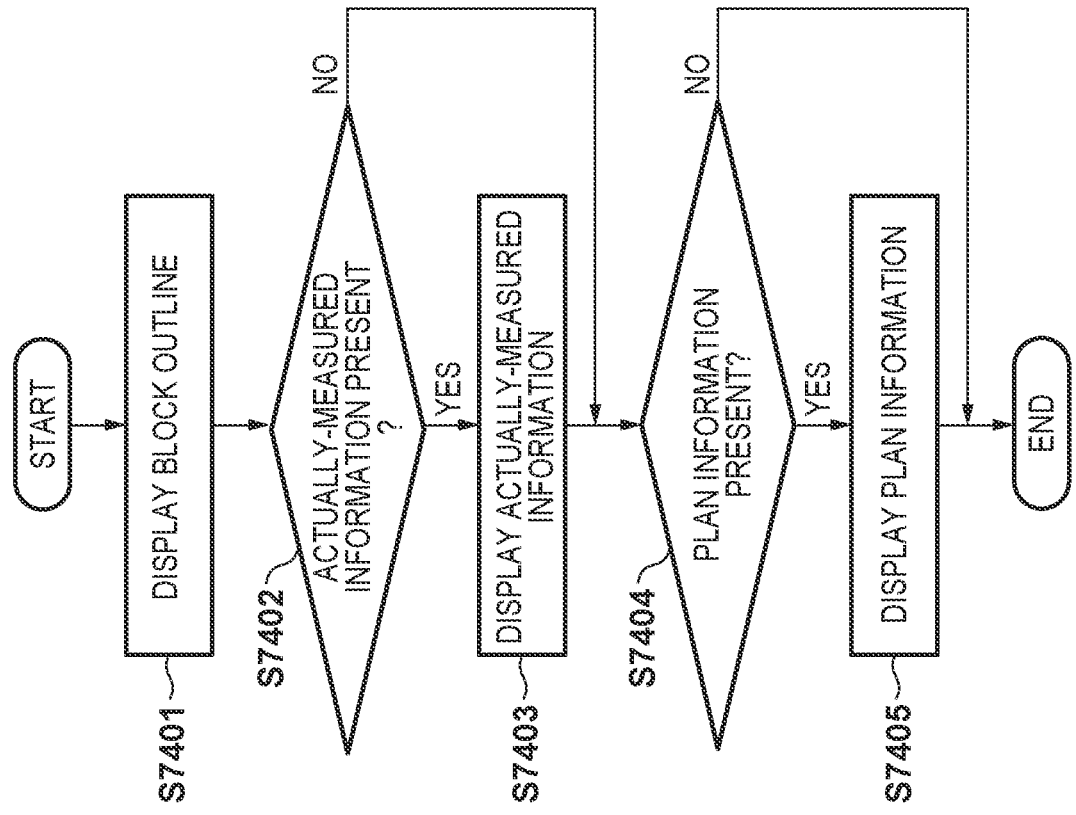
FIG. 13A is a flowchart according to the third embodiment.

FIG. 13A is a flowchart illustrating a processing sequence for a case where both the actual position where sampling was carried out and the plan position pertaining to a position where sampling is to be carried out are present as the sampling reliability information, in which the two types of information are displayed in a superimposed manner.

In step S7401, the processing unit 303 displays a block outline in the sampling reliability information display area. In step S7402, the processing unit 303 determines whether or not information of a position where sampling was actually carried out is present. If it is determined that there is information of a position where sampling was actually carried out (actual measurement information), the process moves to step S7403. However, if it is determined that there is no information of a position where sampling was actually carried out (actual measurement information), the process moves to step S7404.

In step S7403, the processing unit 303 displays the actual measurement information of the sampling position so as to be superimposed over the block outline. In step S7404, the processing unit 303 determines whether or not there is plan information pertaining to the sampling position. If it has been determined that there is plan information, the process moves to step S7405. However, if it has been determined that there is no plan information, the process ends. In step S7405, the processing unit 303 displays the plan information pertaining to the sampling position so as to be superimposed over the block outline.

Sampling Reliability Information Display Example (Display of Both Actual Measurement Information and Plan Information)

FIG. 13B is an example of the display when both steps S7403 and S7405 are carried out. The display content is constituted by a ripeness graph display area 7510 and a sampling reliability information display area 7520. The marker indicated by a white circle 7511 in the ripeness graph represents information of the actual locations where sampling was carried out, and pressing these markers results in the information pertaining to the actual location where the sampling was carried out being displayed in the sampling reliability information display area 7520.

The markers indicated by triangles 7512 in the ripeness graph represent that although there is no actual location information of where the sampling was carried out, there is plan information as substitute information, and pressing these markers results in the sampling plan position being displayed in the sampling reliability information display area 7520.

The marker indicated by a square 7513 in the ripeness graph indicates that there are both actual location information of where the sampling was carried out and information of the sampling plan position, and pressing this marker results in the two types of information being displayed in a superimposed manner.

A black square 7514 in the ripeness graph indicates that that marker is selected. When that marker is selected, a block outline 7521, a position 7522 where sampling was actually carried out, and a sampling plan position 7523 are displayed in a superimposed manner in the sampling reliability information display area 7520. Note that hovering the mouse pointer over the block area, long-pressing the block area, or the like may result in the sampling trust level being displayed at the tool tip as a numerical value.

Equation (2) is an equation for calculating the sampling trust level using the plan information and information of actual measurement values from the sampling position. Displaying the value of the sampling trust level calculated according to Equation (2) makes it possible for the user to easily confirm the reliability of the sampling.

Equation 2

$$f = \frac{le \times N}{\sum_{i=1}^{N} ld_i} \quad (2)$$

The sampling trust level is a value calculated by first multiplying the distance of permissible error from the sampling plan position by the number of sampling plan positions within the block, and then dividing that value by the sum of the distances from the sampling plan positions to the nearest-neighbor sampling positions. The sampling plan positions are not particularly limited but may be arranged at equal intervals within the block, taking the block outline information as a reference.

The meanings of f, ld, le, i, and N in the equation (2) are as follows.

f: sampling trust level ld: distance from the sampling plan position to the sampling plan position at the nearest-neighbor distance le: distance of permissible error from the sampling plan position to the sampling position i: subscript expressing the ith sampling plan position N: number of sampling plan positions within the block

Fourth Embodiment

A fourth embodiment will describe an example in which nearby sampling points are clustered, a clustering number per unit of surface area is taken as the sampling trust level, and the ripeness graph is created in accordance with that sampling trust level. In the fourth embodiment, the term "nearby" means that the distance from a center of gravity position of the sampling points constituting a cluster to each of the sampling points constituting the cluster is within a threshold.

Example of Ripeness Graph Display

Figure 14A:
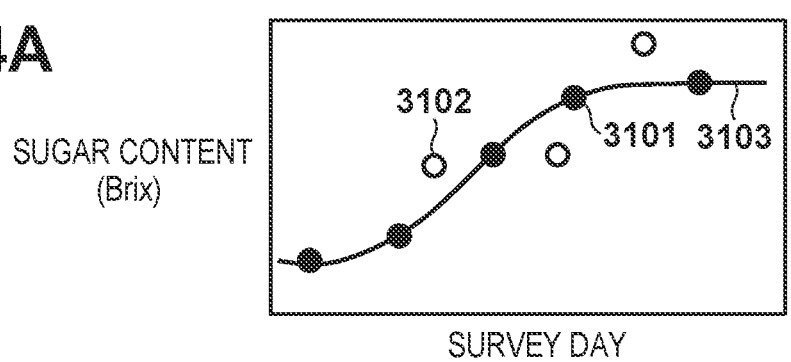
FIG. 14A illustrates a ripeness graph according to a fourth embodiment.

FIG. 14A illustrates an example of the display of the ripeness graph according to the fourth embodiment. Black circles 3101 are markers indicating survey results in which the sampling trust level is greater than or equal to a threshold. White circles 3102 are markers indicating survey results in which the sampling trust level is less than the threshold. A solid line 3103 is an assistive line used for predicting the harvest day, and is a line expressed with a polynomial expression that provides the minimum square distance from the markers 3101 indicating survey results in which the sampling trust level is greater than or equal to the threshold.

The ripeness graph is created having excluded the markers 3102 for which the sampling trust level is less than the threshold. In the fourth embodiment, cluster densities at the survey level, the block level, and the survey item level are used as the sampling trust level. A sequence for calculating the cluster density will be described hereinafter using FIGS. 14B, 14C, 15A, and 15B.

When Two Clusters Are Present Nearby

Figure 14B:
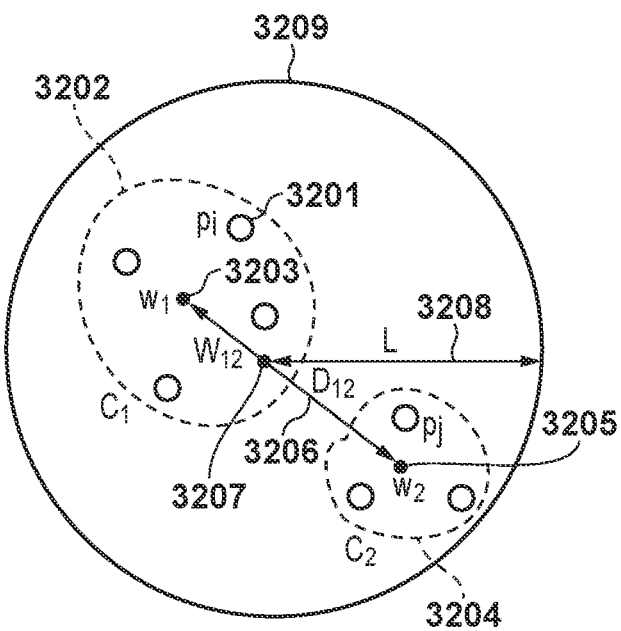
FIG. 14B is a diagram illustrating clusters according to the fourth embodiment.
Figure 14C:
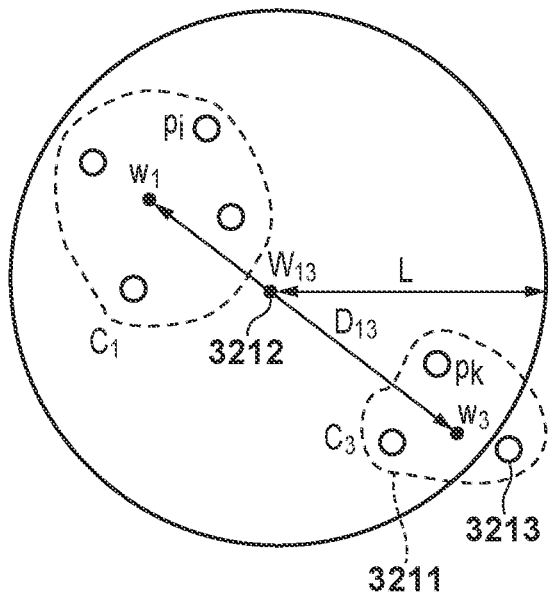
FIG. 14C is a diagram illustrating clusters according to the fourth embodiment.

FIGS. 14B and 14C are diagrams illustrating a method for determining whether all sampling points present in two clusters are nearby. First, FIG. 14B, in which two clusters are nearby, will be described. White circles 3201 represent sampling positions where samples have been gathered. A broken line 3202 represents a cluster $C_1$ constituted by multiple sampling positions. A black circle 3203 represents a center of gravity position $w_1$ of the cluster $C_1$. When the position of a sampling point $p_i$ is represented by $(x_i, y_i)$, the number of sampling points is represented by N, and the center of gravity position of the cluster is represented by (X,Y), the center of gravity position of the cluster can be calculated through Equation (4), mentioned later.

Likewise, a broken line 3204 represents a cluster $C_2$, and a black circle 3205 represents a center of gravity position $w_2$ of the cluster $C_2$. A double-sided arrow 3206 represents a distance $D_{12}$ between the center of gravity position $w_1$ of the cluster $C_1$ and the center of gravity position $w_2$ of the cluster $C_2$. A black circle 3207 represents a center of gravity position $W_{12}$ with respect to all the sampling positions in the cluster $C_1$ and all the sampling positions in the cluster $C_2$.

A double-sided arrow 3208 represents a threshold L for determining that a sampling point is nearby. A circle 3209 is a circle having a radius L, centered on the center of gravity position $W_{12}$. All the sampling positions in the cluster $C_1$ and the cluster $C_2$ are located within the circle 3209, and the clusters are therefore determined to be nearby.

When Two Clusters Are Not Present Nearby

Next, FIG. 14C, in which two clusters are not nearby, will be described. A broken line 3211 represents a cluster $C_3$, and a black circle 3212 represents a center of gravity position $W_{13}$ with respect to all the sampling positions in the cluster $C_1$ and all the sampling positions in the cluster $C_3$.

A circle 3213 represents a sampling point that is within the cluster $C_3$ but that is outside the circle at the distance L from the center of gravity position $W_{13}$.

Because there is a sampling point outside the circle at the distance L from the center of gravity position $W_{13}$ of the two clusters, the cluster $C_1$ and the cluster $C_3$ in FIG. 14C are determined not to be nearby clusters.

Processing

Figure 15A:
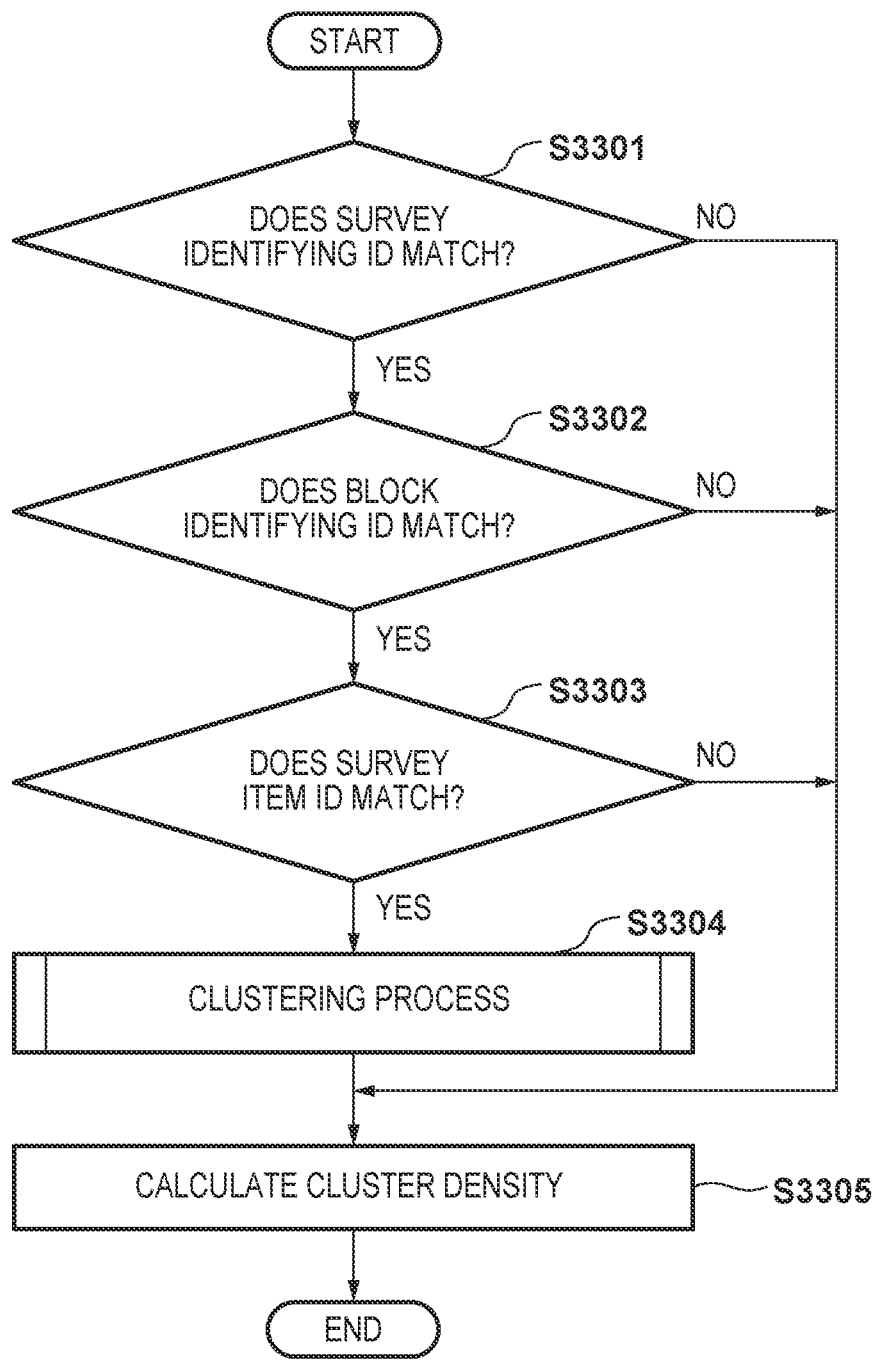
FIG. 15A is a flowchart according to the fourth embodiment.
Figure 15B:
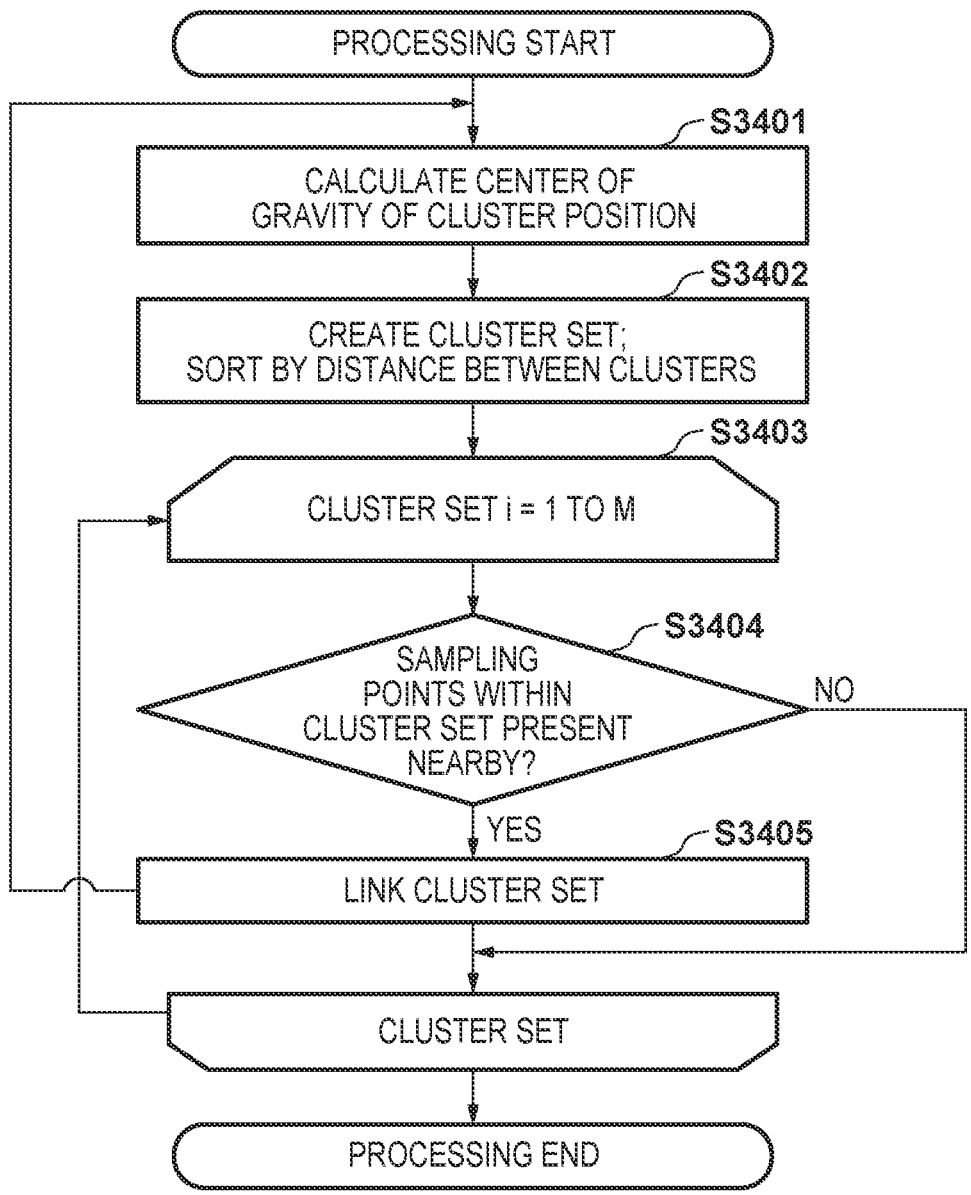
FIG. 15B is a flowchart according to the fourth embodiment.

FIGS. 15A and 15B are flowcharts illustrating processing for calculating a cluster density, which is an example of the sampling trust level. FIG. 15A illustrates the main flow, and FIG. 15B illustrates a subroutine carried out in step S3304. It is assumed that the same type of data as that used in the first embodiment is input to the crop survey support apparatus 300 in advance, and the same type of aggregating process as that of the first embodiment is carried out. In steps S3301, S3302, and S3303 of FIG. 15A, the processing unit 303 extracts sampling data for the survey identifying ID, block identifying ID, and survey item ID subject to the sampling trust level calculation.

In step S3204, the processing unit 303 executes a process for clustering the extracted sampling information. In step S3205, the processing unit 303 calculates the cluster density according to the following Equation (3). The cluster density is calculated by clustering the sampling points within the block in step S3304, counting the number of clusters, and then dividing the count by the surface area of the block.

Equation 3

$$\text{cluster density} = \frac{\text{number of cluster}}{\text{block surface area}} \quad (3)$$

The process of step S3304 will be described in detail next with reference to FIG. 15B. As pre-processing, a cluster containing only a single sampling point is created in advance for each sampling point.

In step S3401, the processing unit 303 calculates the center of gravity position of the cluster through the following Equation (4). In Equation (4), $(x_i, y_i)$ represents the position of a given sampling point, N represents the number of sampling points within the cluster, and (X,Y) represents the center of gravity position of the cluster.

Equation 4

$$\begin{pmatrix} X \\ Y \end{pmatrix} = \begin{pmatrix} \dfrac{\sum_{i=1}^{N} x_i}{N} \\ \dfrac{\sum_{i=1}^{N} y_i}{N} \end{pmatrix} \quad (4)$$

In step S3402, the processing unit 303 creates cluster sets constituted by two clusters, and sorts the cluster sets in order by the distance between the center of gravity positions of the two clusters. The loop of step S3403 is a loop in which processing is carried out on each cluster set in order from the cluster set having the shortest distance between the clusters. M represents the number of cluster sets.

In step S3404, the processing unit 303 determines whether or not the sampling points within the cluster set are nearby. Specifically, it is determined whether all of the distances from the center of gravity position of the cluster set to the sampling points are distances within a threshold. If the determination result is YES in step S3404, the process moves to step S3405. In step S3405, the processing unit 303 links the two cluster sets and adds them to the cluster sets to be processed, removes the pre-linking two cluster sets from the cluster sets to be processed, and returns to step S3401. If the determination result is NO in step S3404, the process returns to step S3403, and if there is an unprocessed cluster set, the same processing is carried out for the cluster set having the next-shortest distance between the clusters. If there are no unprocessed cluster sets in step S3403, the clustering process ends.

Example of Display of Sampling Reliability Information

Figure 15C:
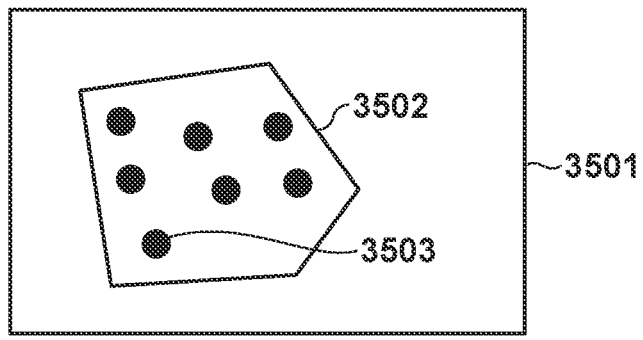
FIG. 15C illustrates a sampling reliability information display using cluster positions according to the fourth embodiment.

FIG. 15C is a diagram illustrating an example of the display of the sampling reliability information according to the fourth embodiment. Although sampling positions were superimposed over a map as the sampling reliability information in the first embodiment, the center of gravity positions of the clusters are superimposed over a map in the fourth embodiment. A frame line 3501 is a map display area. A frame line 3502 is a block outline. Black circles 3503 represent the center of gravity positions of clusters calculated in step S3401 of FIG. 15B. As in the first embodiment, when a marker is selected in the ripeness graph, the center of gravity position of the corresponding cluster is superimposed over the map along with the block outline.

Although the fourth embodiment describes superimposing the center of gravity positions of the clusters over the map, it should be noted that the sampling positions may be displayed in a superimposed manner, as in the first embodiment, even when the clustering process is carried out.

Fifth Embodiment

A fifth embodiment will describe an example of calculating the sampling trust level using mesh block.

Processing

Figure 16A:
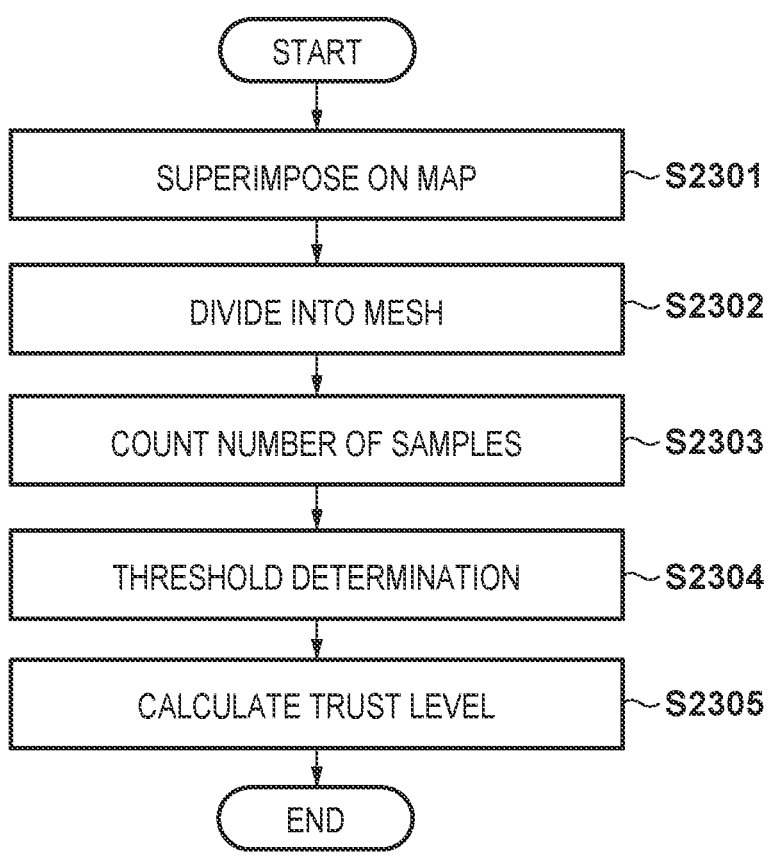
FIG. 16A is a flowchart illustrating the calculation of a trust level according to a fifth embodiment.

FIG. 16A is a flowchart illustrating a processing sequence for calculating the sampling trust level according to the fifth embodiment. FIG. 16B is a diagram illustrating a mesh block carried out with sampling points superimposed over a block. An outer frame 2401 represents the block, a broken line 2402 on an inner frame represents a single section of a mesh obtained from the block, and circles 2403 represent sampling points.

Figure 16B:
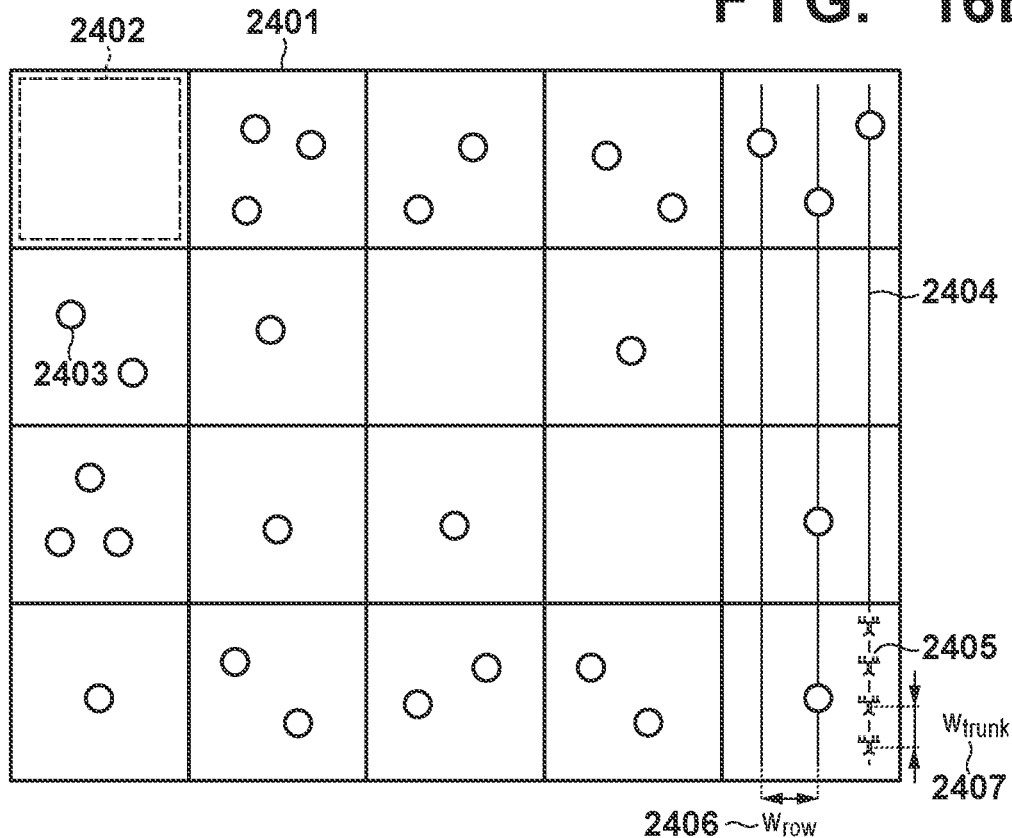
FIG. 16B is a diagram illustrating a mesh block method according to the fifth embodiment.

In step S2301, the processing unit 303 superimposes the sampling points 2403 within the block 2401 as illustrated in FIG. 16B. In step S2302, the processing unit 303 divides the block 2401 into the mesh sections 2402 as illustrated in FIG. 16B. Here, lines 2404 represent rows and symbols 2405 represent the vines (trunks of grapevines), and the mesh is created by dividing the block having set vertical and horizontal mesh intervals so that a predetermined number of vines (grapevine trunks) is present within each section of the mesh. Specifically, the mesh interval is calculated through the following Equation (5), using an interval 2406 between rows in the block information (4414, in FIG. 3B), an interval 2407 between trunks (4415, in FIG. 3B), a number of rows 4416 in each part of the mesh, and a number of trunks 4417 in the row direction within each part of the mesh.

Equation 5

$$\begin{pmatrix} L_r \\ L_w \end{pmatrix} = \begin{pmatrix} W_{row} \times N_{rows} \\ W_{trunk} \times N_{trunk} \end{pmatrix} \quad (5)$$

$L_r$: mesh interval in the direction crossing the rows
$L_w$: mesh interval in the direction following the rows
$W_{row}$: interval between rows
$N_{rows}$: number of rows within a single section of the mesh
$W_{trunk}$: interval between trunks
$N_{trunk}$: number of trunks within a single section of the mesh Note that $L_r$ and $L_w$ may be managed directly as the block information.
In this case, the mesh sections are set so as to have a constant surface area.

In step S2303, the processing unit 303 counts the number of sampling points 2403 in each section of the mesh. In step S2304, the processing unit 303 makes a threshold determination for the number of sampling points in each section of the mesh, using the following Equation (6).

Equation 6

$$x_i = \begin{Bmatrix} c_i < Th_i : 0 \\ c_i \geq Th_i : 1 \end{Bmatrix} \quad (6)$$

$x_i$: value of threshold determination for ith section of the mesh
$c_i$: number of sampling points in ith section of the mesh
$Th_i$: threshold for ith section of the mesh Through the threshold determination made according to Equation (6), a section of the mesh in which the number of sampling points is greater than or equal to the threshold is taken as 1, and a section of the mesh in which the number of sampling points is less than the threshold is taken as 0. The threshold may be set to a different value for each section of the mesh. For example, if it is better to take more samples near the central area of the block, setting a high value for the threshold near the central area of the block makes it possible to determine whether or not the sampling has been carried out as intended.

In step S2305, the processing unit 303 calculates the sampling trust level for the block through the following Equation (7).

Equation 7

$$f = \frac{\sum_{i=1}^{M} x_i}{M} \quad (7)$$

$x_i$: value of threshold determination for ith section of the mesh
M: number of mesh sections within the block
f: sampling trust level for the block Equation (7) indicates that the sampling trust level increases as the value approaches 1, and that the sampling trust level decreases as the value becomes lower than 1.

Example of Ripeness Graph Display

FIG. 17A illustrates an example of the display of the ripeness graph according to the fifth embodiment. FIG. 17A illustrates a situation where the sampling trust level is calculated, and the graph markers are switched among three levels in accordance with the trust level. Triangles 2101 indicate that the sampling trust level is low, squares 2102 indicate that the sampling trust level is medium, and circles 2103 indicate that the sampling trust level is high.

The ripeness graph is used to ascertain the harvest period for the grapes, and when the sampling trust level of the ripeness information is low, the reliability of the slope information of the graph will be low as well. Thus by indicating the sampling trust level on the plots in the ripeness graph in this manner, it becomes easier to determine whether the slope of the graph can be trusted to set the harvest day, or whether the harvest day should be set after examining the ripeness again.

Note that when surveys with both high and low sampling trust levels are present, the ripeness graph may be created using only the survey results for which the sampling trust level is greater than or equal to a threshold. The configuration may be such that the user can specify the threshold for the sampling trust level, and can switch whether or not to include survey results having a medium sampling trust level when creating the ripeness graph.

For example, when there are few surveys with a high sampling trust level, including survey results having a medium sampling trust level makes it possible to grasp the overall trend. However, if a sufficient number of surveys having a high sampling trust level have been carried out, the planned harvest day can be set more appropriately on the basis of the slope of a ripeness graph created using only the survey results having a high sampling trust level.

Example of Display of Sampling Reliability Information

FIG. 17B illustrates an example of the display of the sampling reliability information according to the fifth embodiment. FIG. 17B illustrates a state in which each mesh section obtained from the mesh block has been colored according to the result of the threshold determination made using Equation (6). When a marker is selected in the ripeness graph, the mesh sections pertaining to the corresponding survey are displayed in different colors. For example, mesh sections 2201 indicate mesh sections in which the number of sampling points is lower than a threshold, whereas mesh sections 2202 indicate mesh sections in which the number of sampling points is greater than or equal to the threshold.

Displaying colored mesh sections as the sampling reliability information in this manner makes it possible to visually ascertain spatial information indicating where sampling having a low reliability has been carried out.

Sixth Embodiment

A sixth embodiment will describe an example of calculating the sampling trust level using the sum of nearest-neighbor distances of sampling points.

Processing

Figure 18A:
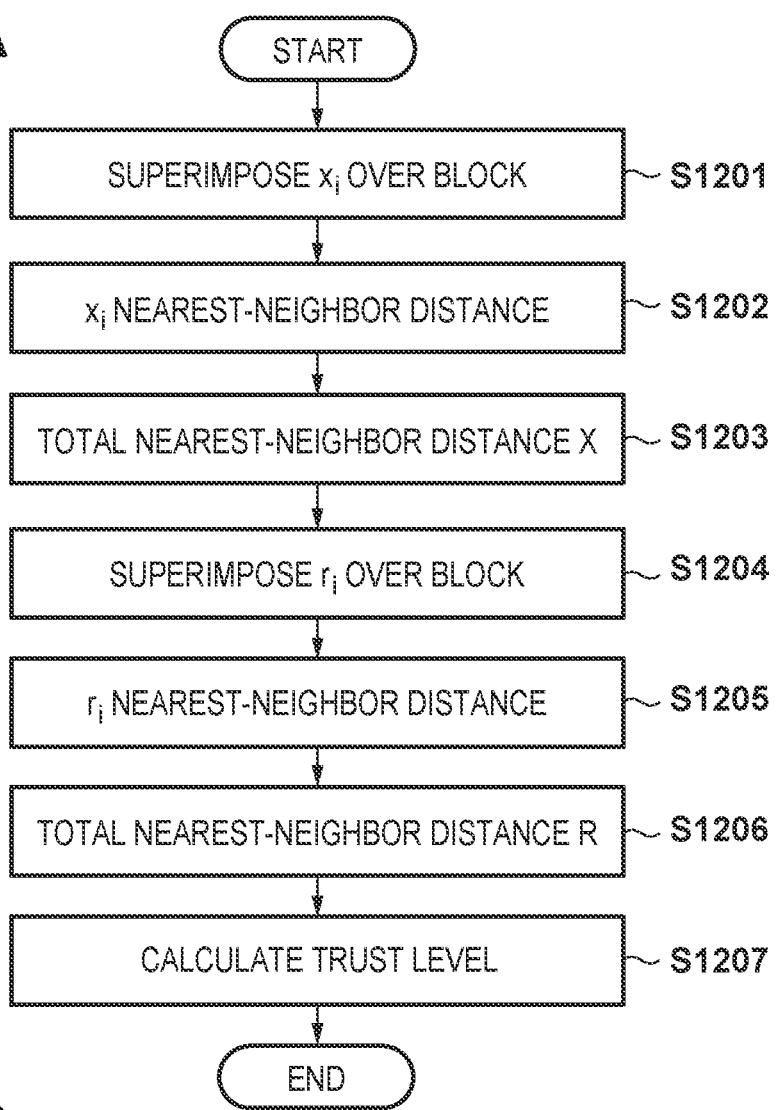
FIG. 18A is a flowchart illustrating the calculation of a trust level according to a sixth embodiment.

FIG. 18A is a flowchart illustrating a processing sequence for calculating the sampling trust level according to the sixth embodiment.

Figure 18B:
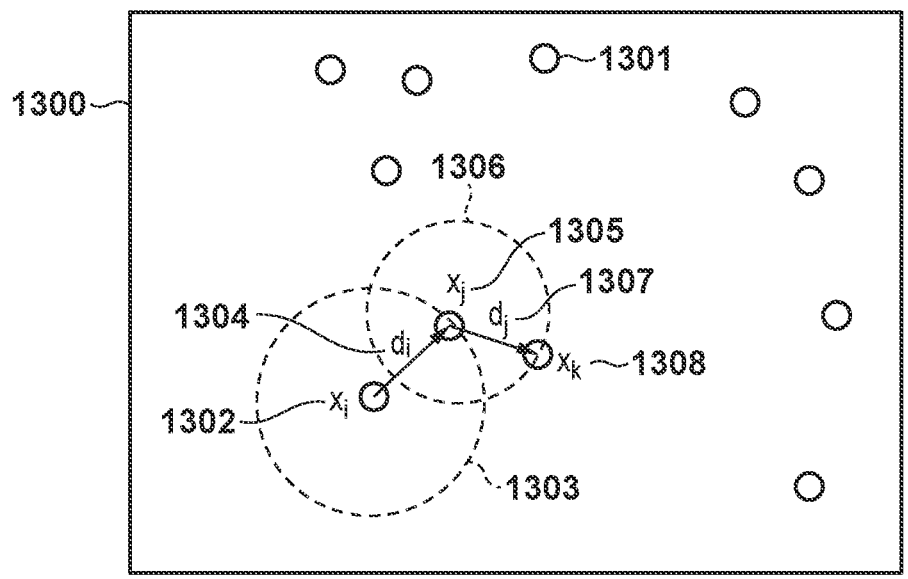
FIG. 18B is a diagram illustrating a flowchart according to the sixth embodiment.

In step S1201, the processing unit 303 superimposes the sampling points within the block. In step S1202, the processing unit 303 calculates the distance from an ith sampling point to the nearest sampling point (the nearest-neighbor distance). Here, the nearest-neighbor distance will be described using FIG. 18B. An outer frame rectangle 1300 represents a block, small circles 1301 represent sampling points, a broken line circuit 1303 represents a circle taking the distance between sampling points as a radius, and the arrows represent the distances between sampling points.

For a sampling point $x_i$ 1302, there are no other sampling points within the circle 1303, and thus a sampling point $x_j$ 1305 is the nearest-neighbor sampling point. A distance $d_i$ 1304 from the sampling point $x_i$ to the sampling point $x_j$ is the nearest-neighbor distance for the ith sampling point. Additionally, for the sampling point $x_j$ 1305, there are no other sampling points within the circle 1306, which takes a distance $d_j$ 1307 to a sampling point $x_k$ 1308 as a radius, and thus the sampling point $x_k$ 1308 is the nearest-neighbor sampling point. In this case, the distance $d_j$ 1307 from the sampling point $x_j$ 1305 to the sampling point $x_k$ 1308 is the nearest-neighbor distance for the jth sampling point.

In step S1203, the processing unit 303 calculates the sum of the nearest-neighbor distances for all of the sampling points in the block to find a total nearest-neighbor distance X. In step S1204, the processing unit 303 uniformly arranges virtual sampling points, corresponding to a number of samples which provides a sufficient sampling trust level for the ripeness survey, within the block.

In step S1205, the processing unit 303 calculates a nearest-neighbor distance $r_i$ for each of the points. In step S1206, the processing unit 303 calculates a sum R of the nearest-neighbor distances of points arranged at random. In step S1207, the processing unit 303 calculates the sampling trust level for the block through Equation (8).

Equation 8

$$f = \frac{X}{R} \quad (8)$$

X: total nearest-neighbor distance of actually-measured sampling points

R: total nearest-neighbor distance of virtual sampling points f: sampling trust level The value of f being significantly lower than 1 indicates that the sampling is insufficient. The value of f being near 1 indicates that the sampling has been carried out properly. The value of f being significantly higher than 1 indicates that excessive sampling has been carried out.

Note that when the survey block is large and the number of samples is sufficiently high, the sum R of the nearest-neighbor distances for the virtual sampling points may then be calculated having arranged the virtual sampling points at random rather than uniformly within the block.

Additionally, when the sampling trust level is used only for comparing surveys, comparing with other blocks, and so on, the block surface area may be used instead of the total nearest-neighbor distance of the virtual sampling points. The equation for calculating the sampling trust level in this case is Equation (9), which uses a block surface area A.

Equation 9

$$f = \frac{X}{A} \quad (9)$$

X: total nearest-neighbor distance of sampling points within the block

A: block surface area f: sampling trust level

Seventh Embodiment

A seventh embodiment will describe an example of calculating the sampling trust level using blocks which take into account the positions and parts of the sampling. As described in the first embodiment, when measuring a sample at each survey point, the direction 4212 and height part 4213 where the sample was gathered are recorded at each survey point, as illustrated in FIG. 3A. Furthermore, although not illustrated in FIG. 5B, when creating the aggregating result data, information of the direction and height (survey direction, survey height) is recorded in each instance of sampling information 4617.

Additionally, as described in the second embodiment, when analyzing samples at a lab, the direction 6112 and height part 6113 where the sample was gathered are recorded at each point where a sample was gathered, as illustrated in FIG. 9A. Furthermore, although not illustrated in FIG. 9C, when creating the aggregating result data, information of the direction and height is recorded in each instance of the sampling information 6317. A method for calculating the sampling trust level, which uses a method of dividing into evaluation space blocks constituted by sampling parts and positions (longitude, latitude), will be described next.

Processing

Figure 19A:
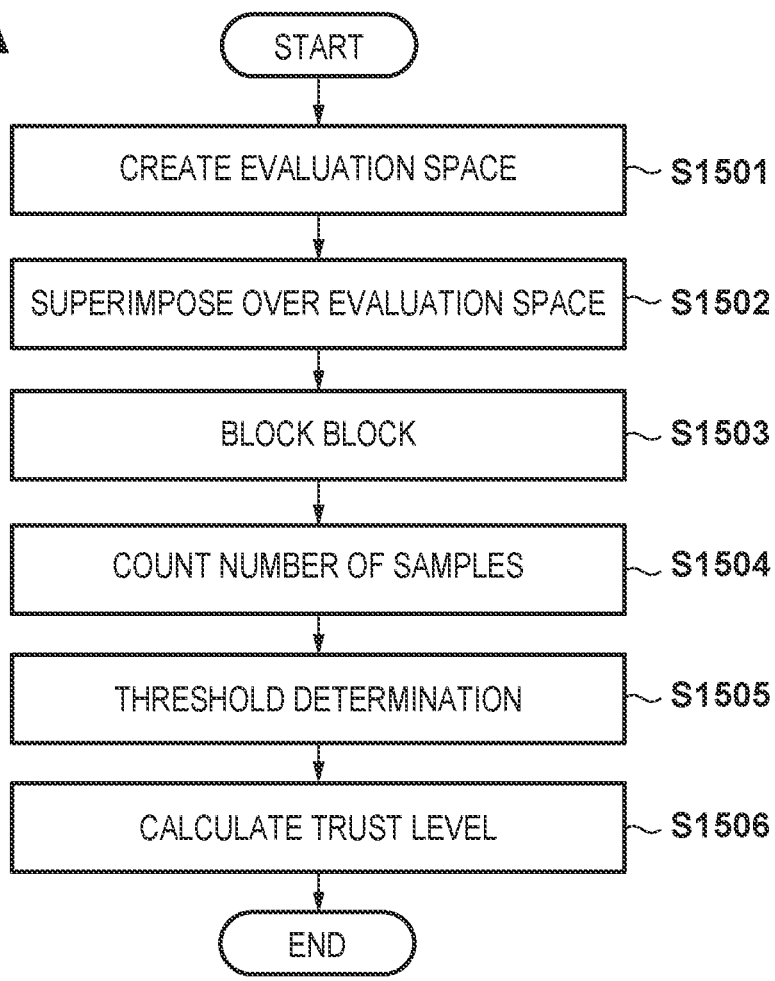
FIG. 19A is a flowchart illustrating the calculation of a trust level according to a seventh embodiment.
Figure 19B:
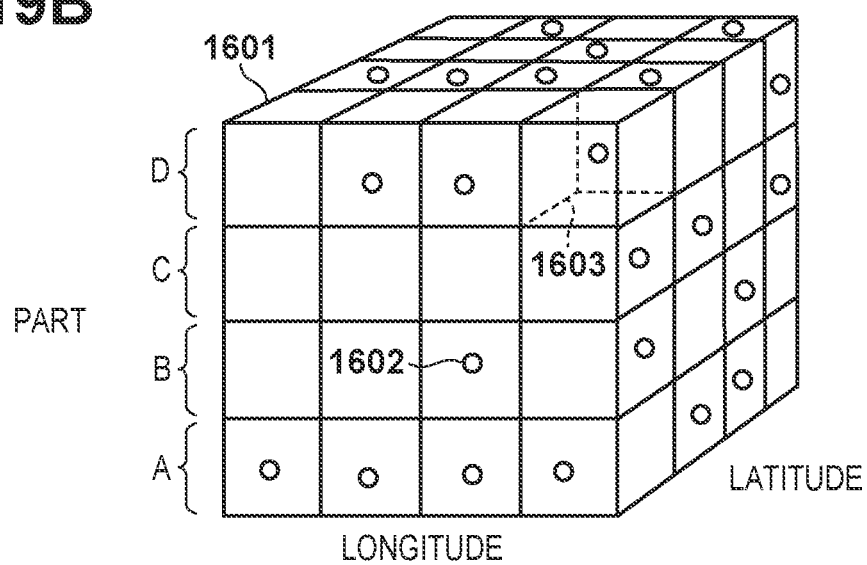
FIG. 19B is a diagram illustrating a flowchart according to the seventh embodiment.

FIG. 19A is a flowchart illustrating the sequence of a process for calculating the sampling trust level using an evaluation block method. FIG. 19B illustrates a space in which latitude and longitude axes are provided with respect to the sampling position, and a part axis is provided with respect to the sampling part.

In step S1501, the processing unit 303 creates an evaluation space 1601 in which the outline of a survey target block is set in the longitude direction and the latitude direction, and in which a survey part pattern is set in the part direction. Here, the survey part pattern is, for example, A (south-facing; top), B (south-facing; bottom), C (north-facing; top), and D (north-facing; bottom) for the grapevines.

In step S1502, the processing unit 303 superimposes a sample instance 1602 over the evaluation space in accordance with the longitude information, latitude information, and part information of the sample. In step S1503, the processing unit 303 cuts a plane formed in the longitude direction and the latitude direction into a mesh in which a set number of grapevines are present, and then divides the space into evaluation space blocks 1603 constituted by mesh sections and parts.

In step S1504, the processing unit 303 counts the number of sample instances 1602 in each of the blocks 1603. In step S1505, the processing unit 303 uses the following Equation (10) to determine whether or not the count value in each of the blocks 1603 is greater than or equal to a threshold, and records the result of the determination.

Equation 10

$$x_i = \begin{Bmatrix} c_i < Th_i : 0 \\ c_i \geq Th_i : 1 \end{Bmatrix} \quad (10)$$

$x_i$: value from threshold determination made for ith evaluation space block $c_i$: number of sampling instances in ith evaluation space block $Th_i$: threshold for ith evaluation space block In step S1506, the processing unit 303 calculates the sampling trust level using Equation (11).

Equation 11

$$f = \frac{\sum_{i=1}^{M} x_i}{M} \quad (11)$$

$x_i$: value from threshold determination made for ith evaluation space block

M: number of evaluation space blocks within the survey target block as a whole f: sampling trust level for the survey target block as a whole Equation (11) indicates that the sampling trust level increases as the value approaches 1, and that the sampling trust level decreases as the value becomes lower than 1.

A method for calculating the sampling trust level, which uses the nearest-neighbor distance between samples in an evaluation space constituted by sampling parts and positions (longitude, latitude), will be described next.

Processing

FIG. 20A is a flowchart illustrating a processing sequence for calculating a different type of sampling trust level according to the seventh embodiment.

In step S1701, the processing unit 303 superimposes a sample instance $x_{pi}$ on the evaluation space. Here, a method for superimposing the sample instance will be described with reference to FIG. 20B. An outer frame 1801 in FIG. 20B represents the evaluation space constituted by the outline of the block and the sampling parts. White circles represents sample instances. The sample instances are superimposed over the evaluation space 1801 in accordance with the longitude information, latitude information, and sampling part information of each sample.

In step S1702, the processing unit 303 calculates the nearest-neighbor distance for the sample instance $x_{pi}$. The method for calculating the nearest-neighbor distance will be described using FIG. 20B.

A sample $x_{Ai}$ 1802 is an instance sampled at a position ($lat_{Ai}, lng_{Ai}$) and at a part A. A sample $xA_j$ 1804 is an instance sampled at a position ($lat_{Ajk}, lng_{Aj}$) and at the part A. A sample $x_{Ak}$ 1805 is an instance sampled at the position ($lat_{Ai}, lng_{Ai}$) and at a part B.

First, the sample instances are grouped according to each sampling part. The sample $x_{Ai}$ 1802 and the sample $x_{Aj}$ 1804 are taken from the same sampling part and therefore belong to the same group. The sample $x_{Ai}$ 1802 and the sample $x_{Ak}$ 1805 are taken from different sampling parts and therefore belong to different groups. The distance between the closest samples within the same group is defined as the nearest-neighbor distance.

In FIG. 20B, the closest sample to the sample $x_{Ai}$ 1802 within the same group is the sample $x_{Aj}$ 1804, and thus the nearest-neighbor distance for the sample $x_{Ai}$ 1802 is a distance $d_{Ai}$ 1803. The sample $x_{Ak}$ 1805 is close to the sample $x_{Ai}$ 1802 but belongs to a different group, and is therefore not a nearest-neighbor sample.

In step S1703, the processing unit 303 adds the nearest-neighbor distances for all the samples, and calculates the total nearest-neighbor distance X for the samples within the block. In step S1704, the processing unit 303 randomly arranges virtual sampling instances, corresponding to a number of samples which provides a sufficient sampling trust level for the ripeness survey, within the block.

In step S1705, the processing unit 303 groups the virtual sampling instances according to the sampling parts, and calculates a nearest-neighbor distance $r_{pi}$ for each virtual sampling instance in the same group. In step S1706, the processing unit 303 adds the nearest-neighbor distances for all the virtual sampling instances, and calculates the total nearest-neighbor distance X for the virtual samples within the block. In step S1707, the processing unit 303 calculates the sampling trust level for the block through Equation (12).

Equation 12

$$f = \frac{X}{R} \quad (12)$$

X: total nearest-neighbor distance of sampling points within the block
R: total nearest-neighbor distance when virtual samples are arranged at random
f: sampling trust level for the block The value of f being significantly lower than 1 indicates that the sampling is insufficient. The value of f being near 1 indicates that the sampling has been carried out properly. The value of f being significantly higher than 1 indicates that excessive sampling has been carried out.

Although the seventh embodiment describes an example in which whether the part where the grapes are located on the vine faces north or south, or is on the top or bottom, is taken into account, other items that affect the ripeness may be taken into account as well. For example, the sampling reliability may be calculated taking into account the right and left sides of the rows, the positions of the bunches relative to the vine, i.e., on the sunny side (outer side) or shady side (inner side), whether the grapes are at the top, middle, or bottom of the same bunch, and so on.

Eighth Embodiment

An eighth embodiment will describe an example of displaying a survey result in scheduler format. The same data structure and processing as in the first embodiment is used for the input to the crop survey support apparatus 300, and the aggregating of, the survey results from the vineyard.

Figures 21A, 21B:
FIG. 21A illustrates a sampling reliability information display according to an eighth embodiment.
FIG. 21B illustrates a sampling reliability information display according to the eighth embodiment.

FIG. 21A to 21C are diagrams illustrating an embodiment in which aggregated data is displayed in scheduler format. FIG. 21A illustrates the state of surveys in the vineyard being displayed in scheduler format, by category and by date. "Category" refers to growth level surveys, estimated harvest amount surveys, ripeness surveys, and so on. Each non-hatched element 8101 represents the existence of record data for a survey for a given category carried out according to a given schedule. A hatched element 8102 represents a specific survey having been selected by the user. The elements 8101 and 8012 in this embodiment are intended to encompass all blocks of the vineyard for which a survey (growth level, estimated harvest date, or ripeness, as the case may be) was carried out on the applicable date(s).

FIG. 21B illustrates an aggregate information display tab for the measurement results, and is an example of a display carried out having read out, from the storage unit 302, data obtained by aggregating the measurement results from the survey selected in FIG. 21A. In this example, 4 blocks are shown. These 4 blocks were part of the same ripeness survey carried out on a certain date. A frame line 8103 is a block outline (corresponding to the block outline 502 in FIG. 4B, for example), and a frame line 8104 is a tool tip for displaying the aggregate information of the measurement results for the survey specified in each block.

FIG. 21C illustrates a sampling reliability information display tab, and is an example of a display carried out having read out, from the storage unit 302, data obtained by aggregating the sampling positions from the survey selected in FIG. 21A. For each of the same 4 blocks displayed in FIG. 21B, a frame line 8105 represents the block outline, and white circles 8106 represent sampling positions, which are superimposed over a map.

With crop surveys, multiple blocks are sometimes examined in a single survey. In this case, using the display format illustrated in FIG. 21A to 21C makes it possible to simultaneously reference the sampling reliability information for multiple blocks pertaining to a specified survey through a single specifying operation. By making it possible to simultaneously reference the sampling reliability information for multiple blocks, assistance can be provided when determining whether there was a sampling problem only in a specific block during a given survey, or whether there was a sampling problem for the overall survey.

FIG. 21D is a diagram illustrating another embodiment in which aggregated data is displayed in scheduler format. While FIG. 21A to 21C illustrate displaying the sampling reliability information separate from the scheduler format display, FIG. 21D illustrates displaying the sampling reliability information along with the scheduler format display. Specifically, both types of information are displayed by switching the display for each survey in the scheduler according to the calculated sampling trust level. For example, gray-filled frame lines 8201 represent surveys with a high sampling trust level, and white-filled frame lines 8202 represent surveys with a low sampling trust level.

Switching the scheduler display according to the sampling trust level in this manner makes it easy to ascertain, at a glance, how surveys with a high sampling trust level and a low sampling trust level are distributed, by time and by item.

Ninth Embodiment

Figure 22A:
FIG. 22A illustrates a sampling reliability information display according to a ninth embodiment.
Figure 22B:
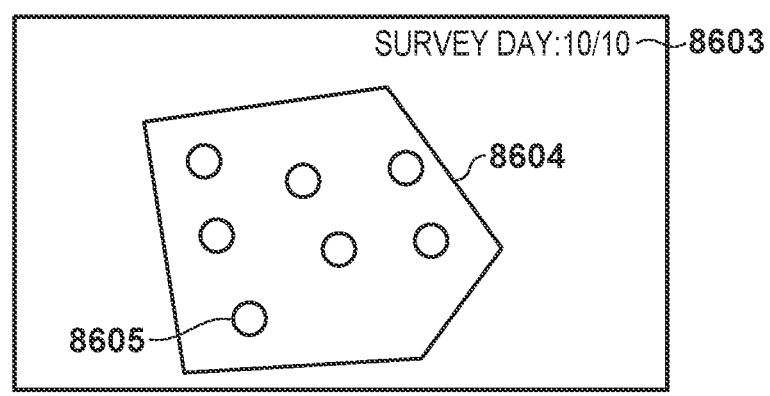
FIG. 22B illustrates a sampling reliability information display according to the ninth embodiment.

A ninth embodiment will describe an example of displaying a survey result in table format. The same data structure and processing as in the first embodiment is used for the input to the crop survey support apparatus 300, and the aggregating of, the survey results from the vineyard. FIGS. 22A and 22B are diagrams illustrating an embodiment for displaying a survey result in table format. FIG. 22A is an example of a area for displaying, in table format, data obtained by aggregating measured values from survey results.

When a block is selected using a pull-down list 8601, aggregate data is read out from the storage unit 302, and information pertaining to the selected block is displayed in a table, in units of surveys. The aggregating result for the measured value is displayed in each row of the table. This example also illustrates a display in which table rows can be selected, with a row 8602 in a selected state.

FIG. 22B illustrates a sampling reliability information display area. When a row is selected, the sampling reliability information corresponding to the survey identifying ID of the selected row is displayed in the display area as indicated in FIG. 22B. A label 8603 is a survey identifying ID, and displays the survey day from FIG. 22A. A rectangle 8604 is an outline of the block selected through the pull-down list 8601. Circles 8605 represent the sampling positions.

Figures 22C, 23A:
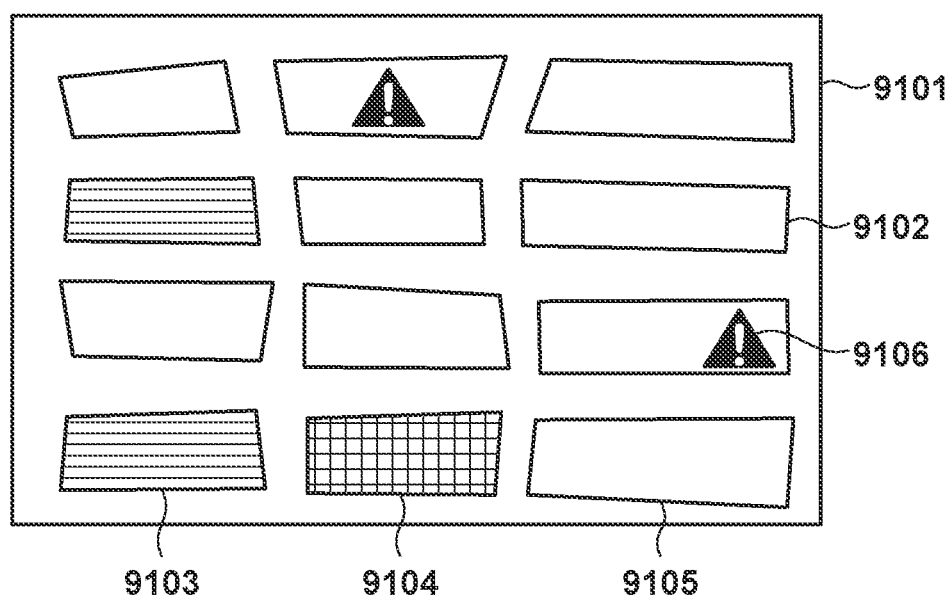
FIG. 22C illustrates a sampling trust level information display according to the ninth embodiment.
FIG. 23A illustrates a display of blocks of a field based on trust levels, according to a tenth embodiment.

Note that a sampling trust level column may be added to the table, as in the table illustrated in FIG. 22C, and the calculated sampling trust level may be displayed as well. If the sampling trust level is displayed in the table, the sampling trust level of each survey can be confirmed at a glance without selecting a row.

Additionally, the configuration may be such that multiple rows of the table can be selected simultaneously, so that the sampling reliability information can be compared among the surveys. In this case, multiple display areas such as that illustrated in FIG. 22B may be displayed side-by-side in the display unit 304. Displaying the sampling reliability information side-by-side in this manner makes it possible to assist the comparison between the relative sampling reliabilities of the surveys.

Tenth Embodiment

A tenth embodiment will describe an example of a screen in which a list of the newest information of each block in the vineyard is displayed. In the screen in which the list of the newest information of the blocks in the vineyard is displayed, the sampling reliability depends on the sampling positions and the number of days which have passed (the time which has passed) since the survey date (the survey date/time). Accordingly, taking into account both of these in the screen in which the newest information is displayed as a list makes it possible to more correctly express the sampling reliability.

FIG. 23A is an example of the screen in which a list of the newest information of the blocks in the vineyard is displayed. A rectangle 9101 represents the outline of the vineyard, rectangles 9102 represent the outlines of blocks, and these are superimposed over a map display area. Horizontal hatching 9103, a grid 9104, and white 9105 are examples of display formats for the newest states of the blocks. For example, the displays are switched in accordance with stages indicating how close the block is to the planned harvest day. Warning icons 9106 indicate that the sampling reliability is low.

Processing

Figure 23B:
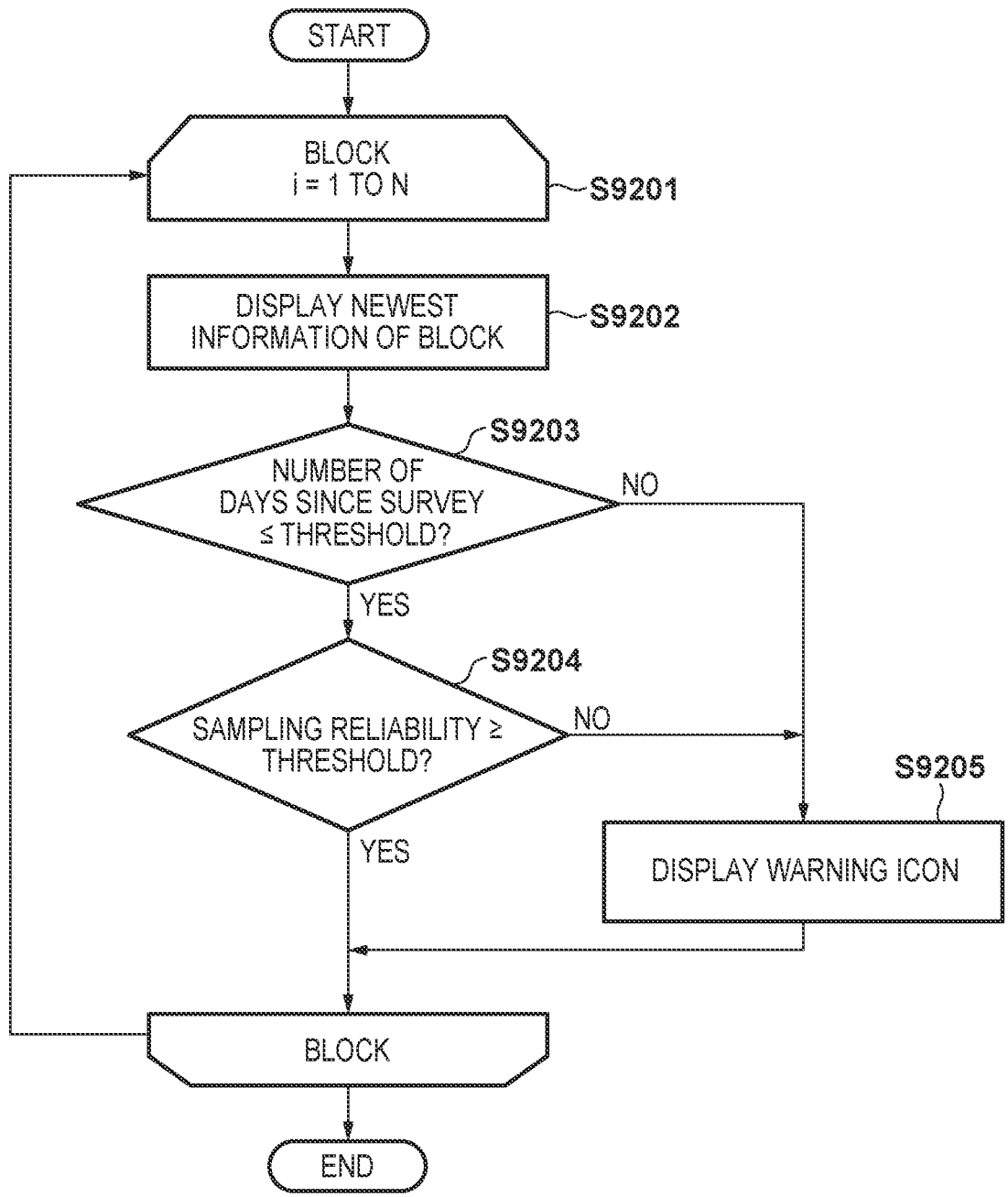
FIG. 23B is a flowchart for the display of blocks of a field based on trust levels, according to the tenth embodiment.

FIG. 23B is a flowchart illustrating the sequence of processing for switching the display of the warning icons 9106 indicated in FIG. 23A. The loop of step S9201 is repeated for each block. In step S9202, the processing unit 303 displays the newest information of each block. For example, if FIG. 23A illustrates a screen for ascertaining the planned harvest day, blocks for which the harvest is planned for that day are displayed with the grid 9104, blocks for which the harvest is planned for tomorrow are displayed with horizontal hatching 9103, and blocks which are not yet to be harvested are displayed with white 9105.

In step S9203, the processing unit 303 determines whether or not a number of days past survey (the amount of time that has passed since the survey date/time) exceeds a threshold. The "number of days past survey" refers to the number of days from the day of the newest survey for that block until the present day. If the number of days past survey is less than or equal to the threshold, the process moves to step S9204. However, if the number of days past survey exceeds the threshold, the process moves to step S9205.

In step S9204, the processing unit 303 determines whether or not the sampling trust level calculated in accordance with the sampling position is greater than or equal to a threshold. If the sampling trust level is greater than or equal to the threshold, an ending determination is made as to whether or not the loop has been repeated for all the blocks, with the series of processes ending if the loop is determined to have been repeated for all the blocks, and the process returning to step S9201 if the loop is determined to not have been repeated for all the blocks. On the other hand, if the sampling trust level is less than the threshold, the process moves to step S9205.

In step S9205, the processing unit 303 displays the warning icon 9106 superimposed over the block. In this manner, the warning icon is displayed in accordance with a determination process which takes into account both the sampling position of the previous survey and the number of days which have passed since the previous survey. Accordingly, if the survey day is old and the reliability of that information has dropped, the user can notice that the information is no longer reliable. Additionally, if the survey day is new but there is a problem with the sampling position, the user can notice that the information is unreliable.

Note that the content of the information displayed may be the growth state, the ripeness, the state of damage from pests, and so on. For example, if the information is the growth state, the display is switched in accordance with a level indicating that the state is normal for the year, is delayed, or is ahead of schedule. If the information is the ripeness survey result, the display is switched in accordance with a level indicating that the grapes are not ripe, that the harvest period is approaching, or that the grapes should be harvested.

Additionally, although FIG. 23A illustrates switching the display of each block using a pattern, a method which distinguishes by color, a method which superimposes numerical value information, a format which displays a tool tip when the mouse hovers over the area or the area is long-pressed, or the like may be used instead. Furthermore, although FIG. 23A uses a map format, a table format may be used as the format for displaying a list of the newest information of each block in the vineyard instead. Note that the foregoing first to tenth embodiments can not only be carried out individually, but also can be carried out in combinations of two or more.

Third Variation

In the foregoing embodiments, the location information is measured using GPS and used as the sampling reliability information. However, in a vineyard where grapes are cultivated, lot numbers are sometimes assigned to the grapevines. In this case, a method may be used in which the lot numbers of the grapevines subject to sampling in the vineyard are recorded, and the crop survey support apparatus converts the lot numbers of the grapevines into location information indicating longitude and latitude.

Additionally, although the foregoing embodiments described carrying out surveys by an examiner using a survey terminal, surveys may be carried out continuously over time by using an environmental camera (PhenoCam), IoT sensors, or the like. If the surveys are carried out continuously over time, segmenting the surveys by date and assigning a survey identifying ID to each date makes it possible to display the sampling reliability information in the same manner as in the foregoing embodiments, switch the displays in accordance with the sampling trust level, and so on.

Additionally, although the foregoing embodiments described carrying out surveys by an examiner using a survey terminal, the invention can also be applied in a situation where the entire vineyard is shot in an unbroken manner using a camera mounted on a drone, a tractor, or the like.

Finally, although the foregoing embodiments described superimposing block outlines and sampling points on a map as a method for displaying the sampling reliability information, a heat map taking each sampling point as an origin may be displayed instead.

Effects

According to the foregoing embodiments, sampling reliability information in blocks corresponding to each of survey results can be displayed with ease. This makes it easy for a user to carry out operations for ascertaining the sampling state. Additionally, in the past, if there was a high number of samples but the sampling reliability was low, it was not possible to confirm that the sampling reliability was low; however, the foregoing embodiments make it possible to correctly display the fact that the sampling reliability is low for a survey in such a case.

According to the foregoing embodiments, the sampling reliability information of a survey for a block can be displayed appropriately in surveys which measure samples at sampling points and record location information. According to the foregoing embodiments, the sampling reliability information of a survey for a block can be displayed appropriately in surveys which collectively measure samples gathered at multiple points within a block and separately record the sampling points at which the samples were gathered.

According to the foregoing embodiments, it is possible to display only survey results having a high sampling reliability when variation in the sampling reliabilities arises due to the number of samples and the survey positions being changed from survey to survey. Additionally, the sampling reliability information can be displayed superimposed over the survey results.

As a result, the user can determine the harvest day or the like having excluded survey results having a low sampling reliability. Additionally, the sampling reliability information can be displayed to the user who references the ripeness graph so that the user can make an appropriate determination, which makes it possible to reduce the survey cost by combining basic surveys with exhaustive surveys.

According to the foregoing embodiments, information of an area within a block that has been examined insufficiently can be displayed for a survey having a low sampling reliability. As a result, the user can plan an efficient additional survey in response to the surveys having a low sampling reliability. According to the foregoing embodiments, a survey having a low sampling reliability and an additional survey carried out for an area within a block that has been insufficiently examined can be treated as a single survey. This makes it possible to obtain a survey result having a high sampling reliability, without wasting labor expenses on surveys having a low sampling reliability.

According to the foregoing embodiments, a ripeness graph can be displayed using only surveys having a high sampling reliability. Accordingly, the user can use the slope of the ripeness graph to make a more appropriate determination when planning the harvest day for that block. According to the foregoing embodiments, a list of sampling reliability information can be displayed for each block. Through this, when setting a harvest order for multiple blocks within a vineyard, the user can make a more appropriate determination by taking into account not only the survey result from each block, but also the sampling reliability information of that survey result.

According to the foregoing embodiments, an appropriate display can be carried out in accordance with the presence/absence of information, a display priority, and so on, when inputting only plan positions to a crop survey support apparatus, when inputting only actually-measured positions to the crop survey support apparatus, and when inputting both the plan positions and the actually-measured positions to the crop survey support apparatus. Through this, an appropriate display can be made using the plan position information, even if the process for actually measuring sampling positions in the vineyard is skipped.

According to the foregoing embodiments, a sampling trust level can be calculated having taken into account the position within the block and the part of the crop, and a display based on the sampling trust level calculated through this method can be switched. It is then possible to display only the survey results having a high sampling trust level, having taken into account the position and part. Displaying only the survey results having a high sampling trust level makes it possible for the user to make a more appropriate determination for the harvest day.

Additionally, according to the foregoing embodiments, the sampling reliability of a plot selected on the ripeness graph can be known, and at the same time, the overall state of multiple surveys carried out as a single survey can be ascertained. Additionally, according to the foregoing embodiments, the fact that observation information is present for the block, in addition to observation information for points in the sampling reliability display area, can be known.

According to the foregoing embodiments, in a screen which references a list of the newest information from multiple blocks in a vineyard, sampling reliability information which takes into account both the number of days which have passed from the survey date and the exhaustiveness of the survey positions can be referenced in a screen that displays a list of the newest information. As a result, when setting a harvest order for multiple blocks, inappropriate determinations based on information not reflecting the actual state can be suppressed.

According to the present invention, the reliability of a crop survey can be ascertained. Thus an appropriate harvest suited to the actual state can be carried out.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-040880, filed Mar. 6, 2019, which is hereby incorporated by reference wherein in its entirety.

What is claimed is:

1. An information processing apparatus that assists a survey of a crop cultivated in each of a plurality of blocks obtained by dividing a field, the apparatus comprising:
   an integrated circuit and/or a processor configured to execute computer-executable instructions stored in a memory that implement:
   an input unit configured to accept, for a survey executed for the crop, an input of (i) identification information identifying at least one of the surveys, (ii) block information indicating a block among the plurality of blocks where the survey has been executed, (iii) item information indicating a survey item of the survey, and (iv) measured values measured at a plurality of survey positions in the survey;
   a storage unit configured to store a result of aggregating the input measured values in association with the identification information, the block information, and the item information; and
   a processing unit configured to cause a transition in the aggregating result to be displayed in a display unit as a result of the survey executed two or more times for the same block among the plurality of blocks and the same survey item,
   wherein the input unit further accepts an input of a user operation specifying part of the transition of the aggregating result displayed in the display unit,
   of the measured values displayed in the display unit, the processing unit causes reliability information of the aggregating result of the part specified by the user to be displayed in the display unit,
   the input unit further accepts an input of information of the plurality of survey positions for a survey executed for the crop, and
   the processing unit calculates a trust level of the survey on the basis of the block information and the information of the plurality of survey positions, and causes the trust level to be displayed in the display unit as the reliability information.

2. The information processing apparatus according to claim 1,
   wherein the reliability information is information pertaining to an imbalance in the plurality of survey positions in the block; and
   for the aggregating result of the part specified by the user, the processing unit causes the plurality of survey positions to be displayed in the display unit in map format along with an outline of the block.

3. The information processing apparatus according to claim 2,
   wherein the storage unit further stores survey position plan information; and
   the reliability information includes information of a plan position included in the plan information.

4. The information processing apparatus according to claim 3,
   wherein the processing unit displays a plan value based on the plan information in the display unit along with the transition in the aggregating result; and
   when, of the transitions in the aggregating result, there is no record for a survey pertaining to the part specified by the user, information pertaining to imbalance, within the block, of the plan positions included in the plan information, is displayed in the display unit as the reliability information.

5. The information processing apparatus according to claim 1,
   wherein when the user has specified an aggregating result for a plurality of surveys among the transitions of the aggregating result displayed in the display unit, the processing unit causes the reliability information to be displayed side-by-side in the display unit for each survey.

6. The information processing apparatus according to claim 1,
   wherein the processing unit creates a map in which values based on distances from each survey position in a block are totaled, and calculates a value obtained by dividing a number of pixels for which the totaled value is greater than or equal to a threshold by a number of pixels in the block as the trust level.

7. The information processing apparatus according to claim 1,
   wherein the processing unit creates clusters, each cluster being a collection of the plurality of survey positions, and calculates a value obtained by dividing the number of clusters by a surface area of the block as the trust level.

8. The information processing apparatus according to claim 1,
   wherein the input unit accepts the input of information of the plurality of survey positions for a survey executed for the crop; and
   the processing unit creates clusters, each cluster being a collection of the plurality of survey positions, and causes an outline of the block and a center of gravity position of each cluster to be displayed in the display unit as the reliability information.

9. The information processing apparatus according to claim 1,
   wherein the processing unit divides the block into a mesh, and as the trust level, calculates a value obtained by dividing a number of mesh sections in which a number of survey positions included in each mesh section is greater than or equal to a threshold by a total number of mesh sections in the block.

10. The information processing apparatus according to claim 1,
    wherein the input unit accepts the input of information of the plurality of survey positions for a survey executed for the crop; and wherein the processing unit divides the block into a mesh, and causes the reliability information to be displayed in the display unit by displaying a mesh section in which a number of survey positions included in each mesh section is greater than or equal to a threshold in a different display format than a mesh section in which the number of survey positions is less than the threshold.

11. The information processing apparatus according to claim 1,
wherein the processing unit calculates a nearest-neighbor distance from each survey position to another survey position in the block, calculates a sum of the nearest-neighbor distances for the survey positions, and calculates the trust level on the basis of the sum.

12. The information processing apparatus according to claim 1,
wherein the processing unit calculates a value obtained by dividing a sum of nearest-neighbor distances for the survey positions by a surface area of the block as the trust level.

13. The information processing apparatus according to claim 1,
wherein the processing unit causes the reliability information, the reliability information being based on a newest state of the survey executed within each of the plurality of blocks obtained by dividing the field, to be displayed in the display unit in a map format expressing the field.

14. The information processing apparatus according to claim 1,
wherein the input unit accepts the input of part information including a survey height and a survey direction at each survey position, for a survey executed for the crop; and
the processing unit calculates a trust level of the survey on the basis of the block information, information of the survey position, and the part information, and causes the trust level to be displayed in the display unit as the reliability information.

15. The information processing apparatus according to claim 1,
wherein the processing unit displays the reliability information on the basis of a predetermined priority order when a plurality of types of surveys have been carried out in a single survey.

16. The information processing apparatus according to claim 1,
wherein the processing unit displays the measured values of a survey for which the trust level is greater than or equal to a threshold.

17. The information processing apparatus according to claim 1,
wherein the identification information identifying one of the surveys is information of a date and time on which the survey was carried out; and
the processing unit switches a display format of the reliability information on the basis of an amount of time that has passed since the survey and the trust level.

18. A method of controlling an information processing apparatus that assists a survey of a crop cultivated in each of a plurality of blocks obtained by dividing a field, the method comprising:
accepting, for a survey executed for the crop, an input of (i) identification information identifying at least one of the surveys, (ii) block information indicating a block among the plurality of blocks where the survey has been executed, (iii) item information indicating a survey item of the survey, and (iv) measured values measured at a plurality of survey positions in the survey;
storing a result of aggregating the input measured values in association with the identification information, the block information, and the item information; and
carrying out processing for causing a transition in the aggregating result to be displayed in a display unit as a result of the survey executed two or more times for the same block among the plurality of blocks and the same survey item,
wherein in the accepting, an input of a user operation specifying part of the transition of the aggregating result displayed in the display unit is further accepted,
in the processing, of the measured values displayed in the display unit, reliability information of the aggregating result of the part specified by the user is caused to be displayed in the display unit,
in the accepting, an input of information of the plurality of survey positions for a survey executed for the crop is further accepted, and
in the processing, a trust level of the survey on the basis of the block information and the information of the plurality of survey positions is calculated, and the trust level is caused to be displayed in the display unit as the reliability information.

19. A non-transitory computer-readable storage medium storing a computer program for causing a computer to execute a method of controlling an information processing apparatus that assists a survey of a crop cultivated in each of a plurality of blocks obtained by dividing a field, the method comprising:
accepting, for a survey executed for the crop, an input of (i) identification information identifying at least one of the surveys, (ii) block information indicating a block among the plurality of blocks where the survey has been executed, (iii) item information indicating a survey item of the survey, and (iv) measured values measured at a plurality of survey positions in the survey;
storing a result of aggregating the input measured values in association with the identification information, the block information, and the item information; and
carrying out processing for causing a transition in the aggregating result to be displayed in a display unit as a result of the survey executed two or more times for the same block among the plurality of blocks and the same survey item,
wherein in the accepting, an input of a user operation specifying part of the transition of the aggregating result displayed in the display unit is further accepted,
in the processing, of the measured values displayed in the display unit, reliability information of the aggregating result of the part specified by the user is caused to be displayed in the display unit,
in the accepting, an input of information of the plurality of survey positions for a survey executed for the crop is further accepted, and
in the processing, a trust level of the survey on the basis of the block information and the information of the plurality of survey positions is calculated, and the trust level is caused to be displayed in the display unit as the reliability information.

* * * * *